(12) United States Patent
Nygaard, Jr.

(10) Patent No.: US 7,483,477 B2
(45) Date of Patent: Jan. 27, 2009

(54) USER INTERFACE FOR SELECTION OF SAMPLING PARAMETERS IN A LOGIC ANALYZER WHOSE DATA RECEIVERS ARE IN GROUPS EACH HAVING A SEPARATE THRESHOLD THAT IS COMMON TO THE CHANNELS WITHIN EACH GROUP

(75) Inventor: Richard A Nygaard, Jr., Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 734 days.

(21) Appl. No.: 11/115,663

(22) Filed: Apr. 27, 2005

(65) Prior Publication Data

US 2006/0256847 A1    Nov. 16, 2006

(51) Int. Cl.
*H04B 3/46* (2006.01)
(52) U.S. Cl. .................. 375/224; 375/220; 375/225; 375/226; 702/67; 702/117; 702/68; 702/66; 702/57; 702/120
(58) Field of Classification Search .......... 375/224, 375/220, 225, 228, 226; 702/67, 117, 68, 702/66, 57, 120
See application file for complete search history.

(56) References Cited

U.S. PATENT DOCUMENTS

| | | | |
|---|---|---|---|
| 6,799,127 B1 | 9/2004 | Sontag et al. | |
| 2003/0158687 A1* | 8/2003 | Nygaard et al. | 702/117 |
| 2004/0024547 A1* | 2/2004 | Nygaard, Jr. | 702/67 |

* cited by examiner

*Primary Examiner*—Shuwang Liu
*Assistant Examiner*—Kabir A Timory

(57) ABSTRACT

Eye diagrams are made for signals on each channel in a group. Outlying signals not exhibiting overlap for a sampling parameter common for all channels may be ignored and a warning given. Selected, normalized eye openings are used to discover optimum sampling parameters for each channel. Locations within each eye opening are ranked according to preference. Algorithms are used to select a single best value for a sampling parameter common to all the channels, and the corresponding best other sampling parameter is found for each channel. One algorithm disregards good choices for many channels to accommodate any remaining channel by using only a commonly agreed upon value (a jury system). Another algorithm gives weight to a choice according to the number of channels that agree on that choice (majority rule). A graphical user interface facilitates the selection, and emphasizes which sampling parameters are constrained to vary together.

11 Claims, 17 Drawing Sheets

FIG. 7

USER INTERFACE FOR SELECTION OF SAMPLING PARAMETERS IN A LOGIC ANALYZER WHOSE DATA RECEIVERS ARE IN GROUPS EACH HAVING A SEPARATE THRESHOLD THAT IS COMMON TO THE CHANNELS WITHIN EACH GROUP

REFERENCES TO INCORPORATED PATENT DOCUMENTS

The subject matter of the present Application pertains generally to the application of eye diagrams to the problem of discovering optimum sampling parameters for a collection of data receivers, and is especially well suited for use with one existing eye diagram measurement technique, although it is by no means limited to use with only that technique. An implementation of that technique is the subject matter of a U.S. Pat. No. 6,785,622 entitled METHOD AND APPARATUS FOR PERFORMING EYE DIAGRAM MEASUREMENTS filed on 29 Oct. 2001 and issued 31 Aug. 2004. An extension of that technique is also of interest, and is described in U.S. Pat. No. 6,810,346 entitled COMPOSITE EYE DIAGRAMS filed 31 Jan. 2002 and issued 26 Oct. 2004.

In addition, three U.S. Patent Applications all filed on 24 Feb. 2005 contain much useful information that is essentially the starting point for the present Application. These three all have, at least at the time of filing, identical Specifications, but we cannot be sure, owing to future issues that might arise during their prosecution, that they will all emerge as Patents still having that property. If we could, then we would settle for incorporating just one; as it is, we are persuaded that it is best to incorporate all three. They are: METHOD FOR NORMALIZATION OF AN EYE DIAGRAM AND SELECTION OF SAMPLING PARAMETERS FOR A RECEIVER, Ser. No. 11/066,673, METHOD FOR SELECTING AND EXTRACTING AN EYE DIAGRAM OPENING FOR SUBSEQUENT PROCESSING, Ser. No. 11/066,674, and USER INTERFACE FOR OPERATING UPON AN EYE DIAGRAM TO FIND OPTIMUM SAMPLING PARAMETERS FOR A RECEIVER, Ser. No. 11/066, 700. Each was filed by Richard A. Nygaard, Jr. on 24 Feb. 2005, and each is assigned to Agilent Technologies, Inc.

Furthermore, U.S. Pat. No. 6,799,127 B1 entitled SIGNAL TRANSITION AND STABLE REGIONS DIAGRAM FOR POSITIONING A LOGIC ANALYZER SAMPLE, filed on 8 Aug. 200 and issued on 28 Sep. 2004 describes the formation and display of a type of diagram ("EYE SCAN") useful in the subject matter to be disclosed herein.

Because the topics described in those Patents and Patent Applications are either points of departure for the present invention, or describe techniques of interest for manipulating data structures that contain eye diagram data, and for the sake of brevity in the present application, each of "METHOD AND APPARATUS FOR PERFORMING EYE DIAGRAM MEASUREMENTS," "COMPOSITE EYE DIAGRAMS," "METHOD FOR NORMALIZATION OF AN EYE DIAGRAM AND SELECTION OF SAMPLING PARAMETERS FOR A RECEIVER," "METHOD FOR SELECTING AND EXTRACTING AN EYE DIAGRAM OPENING FOR SUBSEQUENT PROCESSING," "USER INTERFACE FOR OPERATING UPON AN EYE DIAGRAM TO FIND OPTIMUM SAMPLING PARAMETERS FOR A RECEIVER," and, "SIGNAL TRANSITION AND STABLE REGIONS DIAGRAM FOR POSITIONING A LOGIC ANALYZER SAMPLE" are hereby expressly incorporated herein by reference.

BACKGROUND OF THE INVENTION

General Introduction

Logic Analyzers are members of a class of electronic test equipment that observes collections of digital signals, converts them to instances of corresponding logic values along a time axis, and reports on and analyzes their (logical) activity. This class of test equipment, which we may call data analysis equipment, generally samples only once within each consecutive UI (Unit Interval) or period, takes the sampled value as indicative of the logical value for that UI (through threshold comparison), and does not attempt to reconstruct the underlying analog waveform. A clock signal is either reconstructed from the data or is supplied as a separate signal, and transitions in the clock signal are used to delimit the UI. As the speeds of digital systems increase into the Gigabit per second region the issues of exactly where within the UI to make the threshold decision for a data signal ("delay"), and with what threshold voltage, become increasingly problematic. Quite aside from how the SUT (System Under Test) itself performs these tasks, the Logic Analyzer has to perform them as well, and do so correctly if the measurement of the data is to have any utility. It is conventional for both the threshold and the delay relative to the onset of the UI (as indicated by a transition in the clock signal) to be adjustable by the operator of the Logic Analyzer. Hereinafter, we shall collectively refer to these as 'sampling parameters' and to their individual elements as 'threshold' and 'sample position,' respectively. Some Logic Analyzers even attempt to automate the process of selecting these sampling parameters. These prior art techniques for setting threshold and sample position each have certain associated disadvantages.

An eye diagram is a stylized representation of a signal's behavior. An eye diagram can be made by superimposing a large number of time domain trace segments that each correspond to just an individual UI. Implicit in this idea is the notion that satisfaction of some trigger event (related to the clock signal) allows the correct registration of each segment on the other. This will display both rising and falling edges, and asserted regions (whether HIGH or LOW) each in their same relative horizontal locations, for perhaps a million (or more) cycles of the signal. The result is (hopefully) a central empty opening called an 'eye' (on account of its shape) that is free of any traced activity, since during that time any signal will be either already HIGH or already LOW. At each edge of an eye for a typical (non-pulse) signal is an X-shaped boundary produced by rising and falling transitions, with straight lines above and below the Xs produced by the various consecutive ONEs and consecutive ZEROs in the data. And while it is then possible to discern if in that collection of cycles there were instances of overshoot, slow rise or fall times, or inappropriate asserted voltage levels, knowledge about which cycle(s) is(are) at fault is generally lost. That is a minor price to pay for an easily viewed presentation that gives valuable information about overall margins (the size and shape of the eye). Once any such violations of margins are confirmed, their location in the data (if such information is needed) and their causes can be sought using other test techniques.

For data analysis equipment, such as Logic Analyzers, that capture the logical values once per UI (as opposed to a 'scope that densely samples the actual analog waveform), it is conventional to use the 'X crossing' voltage of an eye diagram as the threshold for a data receiver (comparator), and to delay the capture of the comparison output from the associated clock so as to locate the sample position midway between consecutive crossings. However, this may not actually be an optimum set of sampling parameters. Consider first the matter of threshold voltage. Unlike its brother the DSO (Digital Sampling Oscilloscope) that simply digitizes a waveform and reconstructs it afterward, the Logic Analyzer relies upon a threshold comparator (often called a 'receiver') to decide what the logic value is. So does the SUT. But a receiver can require forty or fifty millivolts of abrupt signal excursion to reliably transition with equal delays in each direction. That may translate to two hundred and fifty millivolts at the input to a passive isolation network at which the signal is actually applied. This is a required amount of signal excursion, called $\Delta V_{min}$. There is also a required minimum pulse duration called $\Delta T_{min}$ that needs to be applied before the output will reliably switch from one state to the other. Half a nanosecond is a reasonable example value for minimum signal duration.

So, when we consider where in an eye opening to locate sampling parameters for best Logic Analyzer operation (or more generally, for best operation of a particular data receiver in whatever kind of equipment) we ought to keep the required minimum voltage excursion $\Delta V_{min}$ and its required minimum duration $\Delta T_{min}$ in mind. Particularly so, if the shape of the eye opening for the applied signal is less than ideal.

Accordingly, another way to define the degree to which a combination of sampling parameters is satisfactory is to take into account the performance requirements of the receiver that is in use, and choose a location that offers equal margins in all directions (i.e, for both directions in each of voltage and in time). This sounds harmless enough, but can be difficult to accurately visualize, particularly if the eye diagram for the signal of interest differs significantly from an ideal or nominally correct shape. Say, for example, the signals of interest arrive over transmission lines that are beset with reflections. This condition can give the eye opening a stepped contour or ringing at one end, and to maximize the ability of the Logic Analyzer (or a receiver in other equipment) to sample correctly we may wish to deliberately move, say, the location of the sample position within the time duration of the UI to gain better access to the $\Delta V_{min}$ required of the signal. The presence of jitter is another factor that affects the situation. But we realize that in changing the sample position we are trading increased voltage margin for a decrease in margin for pulse width. It is not so easy to tell by simple observation where the gain in one parameter's margin begins to erode the minimum margin needed for the other. This is particularly so if the eye diagram has signal occurrences for regions INTERIOR to the nominal eye opening. This last business of signal activity indicated within the nominal eye opening, when combined with different rate of margin consumption versus changes in the sampling parameters, can REALLY complicate the task of finding suitable sampling parameters.

Recently, some data analysis equipment, including Logic Analyzers, have begun to support the ability to perform eye diagram measurements, and new techniques are thus possible within an instance of such test equipment (such as Logic Analyzers) to allow it to automatically recommend or decide the best time within the UI, and with what threshold, to 'sample' an incoming signal to decide its logical value. Such automatic selection (or a recommendation) should take the behavior of the data receiver into account and can be of benefit to the internal operation of the Logic Analyzer when used in its traditional logic analysis capacity (it is desirable that it not mis-sample the data . . . ). In addition, such recommended information (not necessarily obtained from a Logic Analyzer, but perhaps from a 'scope that also does eye diagrams) can also be of use to persons responsible for setting the sampling parameters for the receivers that belong to/are part of the SUT itself, and that are not part of any external test equipment, such as Logic Analyzer.

In the material that follows we shall use the term 'signal' in its usual way (as observable electrical behavior on a conductor), and usually use the term 'channel' when both a signal and its associated data receiver is meant. Functionally, the two terms are frequently equivalent and often interchangeable.

SUMMARY OF THE INCORPORATED MATERIAL

The incorporated eye diagram measurement technique uses tapped delay lines and slightly offset voltage comparators to define (relative to some reference edge of a clock signal) a measurement rectangle described by a duration in time and a range of voltage. A 'HIT' is observed and counted whenever the signal passes through the measurement rectangle, which passage is detected by an arrangement of latches and XOR gates. The size of the measurement rectangle is selected according to the desired resolution for the eye diagram, versus the amount of time desired to take the entire measurement. The location of the measurement rectangle within a UI is left unchanged for some suitable or selected number of clock cycles, after which time the observed HIT count is stored in a data structure indexed by the location. Then a new location is established, and so on until the small measurement rectangle has been positioned within the entirety of the larger space formed by the UI and at least the expected maximum and minimum voltages that the signal is to exhibit. The change in time location within the UI can be accomplished either by a variable delay in the path of the clock signal or by variable delay in the signal path. The change in voltage location of the measurement rectangle is achieved by adjusting the threshold voltages without changing the difference between them. An eye diagram is formed by data reduction and analysis performed on the data structure.

Composite eye diagrams are formed by superimposing individual eye diagrams for a number of signals (channels) to form a single combined eye diagram.

To find optimum sampling parameters, an eye diagram is made for a signal that is applied to a receiver whose required minimum voltage excursion $\Delta V_{min}$ and required minimum pulse width $\Delta T_{min}$ are known. The eye diagram data exists in an original eye diagram data structure indexed by combinations of (time, voltage) that were measured with convenient original granularities. The voltage axis of the eye diagram is re-scaled by dividing it by $\Delta V_{min}$, and the time axis is re-scaled by dividing it by $\Delta T_{min}$. This makes each axis appear as a figure of merit. The eye diagram data of the original granularities is re-sampled through interpolation techniques to new granularities where each axis has in a normalized eye diagram data structure the same number of indexed locations per unit of figure of merit.

A normalized description of an eye opening of interest is obtained through an identification and extraction process.

According to one technique a shape symmetric about its center is expanded about the different possible trial centers within the normalized eye opening. The center of the largest shape that 'fits' is a location that represents optimum sampling parameters when mapped back into the original time and voltage coordinates. Suitable symmetric shapes include squares and circles. Symmetric shapes are appropriate because the normalization produces a coordinate system where a step along one axis represents the same increase or decrease in margin along that axis as does a step along the other axis. Thus the trade-off in performance between steps along the time and voltage axes is one-to-one, a circumstance which eases the task of finding an optimum combination of threshold and sample position.

According to another technique the normalized eye opening is reduced in size by removal of successive layers of locations until only one central location remains. As before, that location represents optimum sampling parameters when mapped back into the original time and voltage coordinates.

The eye opening identification/extraction process and the locating of optimum sampling parameters involve mostly discrete representational techniques akin to mechanical models, as opposed to formal analysis pursued through trigonometry or analytic geometry. To see if a shape fits in an eye opening we do not compute perimeters and solve equations for the intersections of lines: we load normalized data structures with marks that represent the shapes and regions involved, and then traverse them while checking their locations for belonging to more than one construct (e.g., belonging to both a square and an eye diagram boundary). This comports nicely with the use of normalized coordinates and symmetrical shapes.

In the case where a Logic Analyzer is connected to a System Under Test the Logic Analyzer can make the eye diagram for each signal it is sent and use the above described techniques to set sampling parameters for its own internal threshold comparators/data receivers (since it is previously informed about the required minimum voltage excursion $\Delta V_{min}$ and required minimum pulse width $\Delta T_{min}$ of its own receivers).

In the case where the optimum sampling parameters are desired for a data receiver that is part of another system, the eye diagram for the signal applied to that receiver may be obtained by the use of suitable test equipment, such as a Digital Sampling Oscilloscope. The eye diagram can then be normalized according to supplied performance data ($\Delta V_{min}$ and $\Delta T_{min}$) for the receiver of interest, and the above described techniques for finding the optimum sampling parameters applied to that normalized eye diagram. This normalization and discovery of optimal sampling parameters can be performed either by software included within appropriate associated test equipment (e.g., a Logic Analyzer, Eye Diagram Analyzer, Digital Sampling Oscilloscope, or other item of data analysis equipment) or it can be accomplished by an application program executed on a computer that is separate from any such test equipment.

We could proceed as set out above, which might be described as Measure (an eye diagram), Identify (an eye opening), Separate (that eye opening), Normalize (the separated region) and then Process (the normalized region for some purpose, such as sampling parameter identification). Alternatively, we could Measure, Normalize (the whole eye diagram!), Identify, Separate, and then Process.

The Specific Issue

All of the techniques described to this point concern the behavior of a single signal within a single channel. A related but new set of concerns arises when multiple signal environments, such as buses, are considered.

Some equipment (Logic Analyzers or SUTs) may provide totally independent selection of both the threshold and sample position for each data receiver. If such were the case, then each channel can be individually optimized as described in connection with the incorporated "METHOD FOR NORMALIZATION OF AN EYE DIAGRAM AND SELECTION OF SAMPLING PARAMETERS FOR A RECEIVER," "METHOD FOR SELECTING AND EXTRACTING AN EYE DIAGRAM OPENING FOR SUBSEQUENT PROCESSING," and "USER INTERFACE FOR OPERATING UPON AN EYE DIAGRAM TO FIND OPTIMUM SAMPLING PARAMETERS FOR A RECEIVER", and no further steps need be considered.

However, it is sometimes the case, as with the 16754A, 16760A and 16910A Logic Analyzers from Agilent Technologies, that input channels are grouped into electrical collections served by probe pods and large scale integrated circuits, and some flexibility has been given up in the service of reduced manufacturing costs. In these particular example cases the sample position remains fully adjustable on a per channel basis, but all seventeen channels for a (1691 OA) probe pod are required to share a common threshold. (The 167654A and 16760A each have a group of sixteen channels plus a separate seventeenth channel available for clock duty, with a combined total of two thresholds.) We shall get to the rationale for this business of common thresholds in a moment. Lastly, there may also be the case where there are many channels to be received, but all the receivers operate with the exact same sampling parameters. This might well be the case for data receivers of a bus that is an internal mechanism within some system that is not test equipment and where the bus is not expected to be connected to the outside world. In each of these latter two cases of singly and doubly constrained sampling parameters, a compromise will probably be needed for best overall operation, as what will constitute optimum sampling parameters for one channel will not be optimum for another.

One can appreciate that the dedicated internal working of a self-contained system might have a single set of sampling parameters (the doubly constrained case), as it is a definite expense to do otherwise. Furthermore, even if one were to contemplate it, the ability to individually set the sampling parameters on a per channel basis requires an easy way to decide what the optimum sampling parameters actually are. The incorporated "METHOD FOR NORMALIZATION OF AN EYE DIAGRAM AND SELECTION OF SAMPLING PARAMETERS FOR A RECEIVER," "METHOD FOR SELECTING AND EXTRACTING AN EYE DIAGRAM OPENING FOR SUBSEQUENT PROCESSING," and "USER INTERFACE FOR OPERATING UPON AN EYE DIAGRAM TO FIND OPTIMUM SAMPLING PARAMETERS FOR A RECEIVER" show how to do that on a per channel basis, but then the resulting knowledge needs to be implemented with corresponding functionality in the system. (That's where the expense comes in!) A reasonable alternate approach for the doubly constrained many signal case is to normalize the eye opening of the composite eye diagram for the collection, and then select one set of optimal sampling parameters for that eye diagram, as though the composite were a for a single channel. (The incorporated "COMPOSITE EYE DIAGRAMS" describes the creation of composite eye diagrams.) However, this is only easily done if all the channels have the same $\Delta V_{min}$ and the same $\Delta T_{min}$.

As performance needs increase, such environmental hazards as Data Dependent Jitter, crosstalk, reflections and skew can seriously degrade a (doubly constrained) compromise intended to be acceptable to all channels, or even prevent the existence of such a compromise. These pressures can force a change in the design to become one where the channels have at least some individual sampling parameter flexibility. For economic reasons that may mean variability for just one of the two sampling parameters (the singly constrained case).

Logic Analyzers include some singly constrained examples that are of interest. From their beginning, most Logic Analyzers have had probe pods that assist with connecting the signals of interest to the Analyzer. The probe pod might have provision for short flexible 'flying leads' with mini-grabbers or push-on sockets on their ends. Flying leads are the do-it-yourself means for connecting to the signals on interest. A more civilized approach (at least for buses) is to simply place a suitable connector on the business end of the probe pod. The connector mates with another that is part of the SUT, and that presents the signals of interest. This eliminates the error of putting wrong flying lead on a signal, or the worry of its coming loose at an inopportune time.

But probe pods are more than simply housings for interconnection. They also contain essential electrical stuff. Some manufacturers put real buffer amplifiers in there, and send the beefed-up signal over long (up to four feet) cables to the Analyzer proper, where the actual data receivers are located. Some (as in the old days) might locate the data receivers in the probe pods, and use their hefty output stages to drive the long cable. In Agilent's current architecture the probe pods contain passive isolation networks (think: attenuation and impedance matching) that couple the SUT's signals to the long cable, while the data receivers are at the other end of that long cable. (The attenuation is five or six to one, so that an actual $\Delta V_{min}$ of about 40 mv at the data receiver proper may appear as a specified 250 mv at the point of signal connection to the probe pod.) The variable delay for sample position is accomplished by tapped delay lines in the mainframe of the Analyzer (rather than in the probe pod), and are generally individually adjustable.

In the case where the probe pods contain the actual data receivers and in the case where they contain isolation networks, various circumstances may compel the designer to declare that all channels served by a given probe pod are to share a common threshold. The number of needed interconnects is a good example of such a reason. If a probe pod for sixteen signals is to have sixteen variable thresholds, then it is reasonable to expect that sixteen (probably shielded) analog reference voltages need to be supplied to the probe pod. This means expensive connectors and more complicated (and expensive!) long cables that connect the probe pod to the mainframe of the Analyzer. So, what they get instead is one threshold voltage to be shared by all comparators within the probe pod.

Even in the case where the probe pod contains only passive isolation networks, there is the matter of custom medium and large scale integration inside the Analyzer. The comparators that are the data receivers are located in such parts, and at some point in time somebody decided that they would put as many repetitions of the needed circuitry as was comfortable in a certain size package. Pin-out for that package and various cost factors limit that number of repetitions. Said another way, at some point in time parts were developed that valued package density over the extra functionality of separate thresholds that would require at least one more pin per section. These otherwise suitable parts are in production, and to re-design them is a considerable expense that probably won't be undertaken until there is a perceived customer requirement for such a change.

We have focused on the situation where a common threshold for a number of data receivers is an aspect of some system's operation. One can imagine other circumstances where it might be a common delay that is required, while thresholds are individually variable. (Say, for example, sample position were attained by a single variable delay in a clock path.) In either case, the question of how to optimize the singly constrained sampling parameters for the collection of channels arises, when less than both sampling parameters are separately variable for each individual channel and one of them is to remain common for all channels in the collection (although it may vary and need not be fixed—whatever it is, it is the same for all channels). A particular example is when one of them is to be common for a group of data receivers in a Logic Analyzer setting where a group of eight (or sixteen or seventeen, the number is exemplary) channels all share a common threshold. It is clear that a threshold setting that is optimal for one channel in the probe pod might not be optimal for another (or any of the others—they might each be different!). What is more, we are reminded from the incorporated "METHOD FOR NORMALIZATION OF AN EYE DIAGRAM AND SELECTION OF SAMPLING PARAMETERS FOR A RECEIVER" that the best overall combination of threshold and sampling position may be one that does not include the (when considered in isolation) individual best threshold or the individual best sample position: they each influence the degree of margin by which the other operates correctly. (Recall the case of the area of a variable rectangle with fixed perimeter. The maximum area does not occur when either of the sides is longest—then the area is zero—but instead occurs when a square is formed. A similar situation arises with margins for sampling parameters.) Thus, we see that there are various ways in which a system, whether it be an SUT or genuine test equipment, can arrive at being constrained to use a common parameter (either threshold or sample position) for each signal in a collection of related signals. The urge to optimize sampling parameters with an automated mechanism remains, however, as it is a difficult thing to do manually by mere inspection, and requires taking $\Delta T_{min}$ and $\Delta V_{min}$ into consideration (whose values may not be known or appreciated by the operator). But what is optimal for one channel is probably not optimal for another, and what is a reasonable compromise for a group of some channels (assuming we can devise a way to define and find such a thing) may be poison for another channel or group. Yet, we would like to have an automated mechanism that is reliable in its recommendation or selection of an optimum set of sampling parameters for a collection of signals, particularly if it is constrained to use a common parameter, such as either threshold or sample position, for each signal in the collection. What to do?

SUMMARY OF THE INVENTION

First, if not already known, the relevant documentation for the data receivers in use is consulted to find the various $\Delta T_{min}$ and $\Delta V_{min}$ for the channels in a group. Then eye diagrams are made for the signal on each channel. In the case where a common threshold is to be a sampling parameter shared by the channels in the group, we inspect these original eye diagrams to obtain the effective highest and effective lowest voltage for the top and bottom of each (un-normalized) eye opening. These define respective voltage ranges of signal swing $V_{swing}$. These ranges are first inspected for reasonable overlap, for if there are no signals whose signal swings overlap there simply is no hope of any compromise that functions even poorly for the channels in the group, and the inquiry is at an end. Presumably, a majority of the channels will exhibit significant overlap, and the optimization inquiry can proceed. However, there may be one or more signals for which there is no overlap with a group that does overlap within itself. In that case those non-overlapping signals are ignored and the operator is given a warning, while the balance of the activity proceeds.

From the original eye diagrams are also prepared respective normalized eye openings. These are then used to discover the optimum sampling parameters for each channel, according to the teachings of the incorporated "METHOD FOR SELECTING AND EXTRACTING AN EYE DIAGRAM OPENING FOR SUBSEQUENT PROCESSING" and "METHOD FOR NORMALIZATION OF AN EYE DIAGRAM AND SELECTION OF SAMPLING PARAMETERS FOR A RECEIVER." A by-product of the normalization and selection of (optimal) sampling parameters is that we can order, or rank, all locations within each eye opening according to preference, from highest (best, or most optimal) to lowest (worst, or least optimal). From this is produced an ordered list of preferred actual original threshold voltages (i.e., they are not expressed in their normalized form) for each channel. These lists are adjusted so that they are each expressed in terms of a common increment to streamline the upcoming comparison process.

According to a first preferred method, it is as if the channels acted as autonomous agents and each proffered its best choice for threshold to all the others, gradually including ever more (but always slightly less desirable to its owner) thresholds in the proffer until all channels have proffered a threshold that is actually same voltage. This constitutes an agreed upon common threshold voltage, and each channel then uses this to find its personal associated best sample position for that voltage. (It can get this from an inspection of its own ordered list of sampling parameters.) These choices may be presented (or not) to the operator for ratification or modification, after which they are implemented and life goes on. Of course, the channels need not be autonomous actors and the above-described agreed upon threshold selection could actually obtained by a single "executor" that inspects the ordered lists of adjusted thresholds and that also subsequently finds the associated best individual sample position for each channel.

According to a second preferred method, all possible instances of agreed upon threshold voltage values are discovered by inspection of the adjusted lists and those values enumerated in a list of all possibilities (which may range from really good to downright rotten). Then that list of all possibilities is ranked for the best selection according to the number of channels that would accept it. That is, we find the threshold voltage that is acceptable to the greatest number of channels, with secondary selection for tie breaking. After that selection each channel finds (as above) its individually preferred associated sample position.

In the corresponding case where the thresholds are allowed to vary and the sample position is common for all channels, the operations are similar, but with the role of threshold and sample position interchanged.

A GUI (Graphical User Interface) tailored to accommodate certain aspects of the multi-channel nature of the optimization and selection problem allows operator to either ratify selections, or, experiment with and then ratify original or modified selections, after the system has made initial recommendations. The GUI also allows the explicit selection of channels that are required to be involved in the multi-channel optimization, whether by being included or by being excluded. The GUI also emphasizes the interaction caused by the constraining of parameters.

BRIEF DESCRIPTION OF THE DRAWINGS

FIG. 7 is a simplified depiction of a screen of a Logic Analyzer GUI used in setting up the correspondence between channels of probe pods and labeled groups;

DESCRIPTION OF A PREFERRED EMBODIMENT

Figure 1:
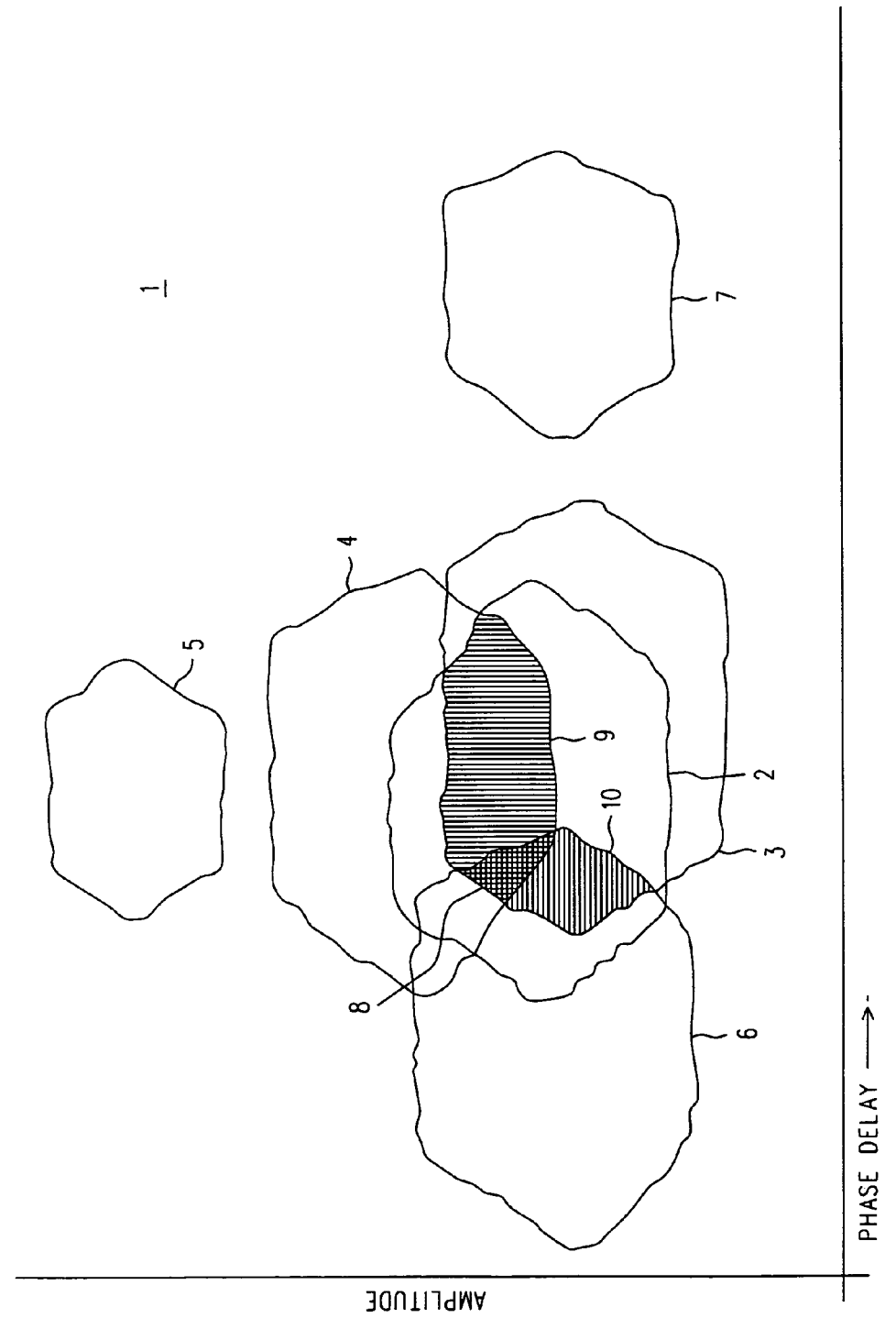
FIG. 1 is a simplified illustration of how eye diagram openings can be related for a typical collection of data signals.

Refer now to FIG. 1, wherein is shown a simplified representation 1 of a collection of eye diagram eye openings that is a useful point of departure for the discussion that follows. We have suppressed the actual eye diagrams themselves in favor of simply an outline of the principal eye openings defined by the bounding traces that are the eye diagrams proper.

As an aside, we would prefer, although it is not absolutely necessary, that the eye diagrams of interest (from which we shall extract eye openings of interest) be made using a technique that is the same as, or similar to, the one set out in the incorporated "METHOD AND APPARATUS FOR PERFORMING EYE DIAGRAM MEASUREMENTS." In any event, we do expect that the measured eye diagram data is left in suitable eye diagram data structures so that it may be examined and variously manipulated, after the general fashion described in several of the incorporated patent documents.

We are not implying that any of the particular manipulations described therein are to be used in the operations to be described herein (although they might be if such were useful), only that the general manner in which such manipulations are made possible through examination and alteration of the content of a data structure containing eye diagram data is a known conventional technique, as well as being one of interest. In summary, if the eye diagrams of interest are obtained according to the method taught in "METHOD AND APPARATUS FOR PERFORMING EYE DIAGRAM MEASUREMENTS" then they are already represented by suitable data structures. If they are made according to other means, then their representation may need to be converted to such a data structures, or to something that is comparable.

What is of interest to us in FIG. 1 is the manner in which the various eye openings are related. Each is for a different signal, and because of the way we have shown them, the arrangement represents somewhat of an abstraction whose content has been concocted to serve as some useful examples of circumstances we are interested in.

For example, eye openings 2, 3, 4 and 5 might be for companion signals in a collection of interest. However, if a common threshold were required for them, then there is trouble afoot since eye opening 5 does not share in any of the region of overlap (the union of hatched regions 8 and 9). That is, if there is to be a common threshold for those signals, then it must lie somewhere within the vertical extent of region 8 combined with region 9, and that extent does not overlap the vertical extent of opening 5.

Why might this happen? First, it may represent a malfunction or the like, and having been detected, will (probably?) be fixed. On the other hand, it might be entirely normal, say, because the signal with eye opening 5 is of a logic family different from the others. (This might happen if a free channel on another probe pod is not available for that signal.) In any event, the situation will either be fixed or the response will be to exclude the channel from consideration and proceed with the measurement. So, for our purposes of finding a common threshold, this situation would result in a warning to the operator that such and such a channel was being excluded, and if that were okay, to resume such activities as will be described, but without taking that channel into account for the selection of sampling parameters.

We should note that there are other reasons why a channel might be excluded from such consideration. These include channels that are not part of a measurement because they were not connected on purpose. Perhaps they are absent from a list of channels declared to be in use, or appear on a list of unused channels. A channel might be in use but connected to a sick signal that is either stuck or has insufficient voltage swing. A variant of this is the flying lead that is accidentally connected to a ground or a power supply. Finally, there is the case where the signal is one that fails to have a useable eye opening because it is not synchronous with the clock. Note that this last idea is more comprehensive than simply observing that there is no overlap in the $V_{swing}$ for the various signals, and has to do with the very existence of an eye opening in the first place. We remain quite interested in the ability to detect and exclude a channel in such a case, since we note that we cannot select sampling parameters for an eye opening that isn't there .... It will also be appreciated that more than one such 'outlying' channels might be excluded (whether purposefully as not being of interest, or for lack of overlap, or for lack of an eye).

To this point, we have assumed that because eye openings 2, 3 4 and 5 are more or less vertically aligned that they represent corresponding bits provided by their respective signals. That is, supposing that those four signals represent four adjacent bits in a parallel presentation of bits, that their content (bit value) was applied in unison, and that such content has arrived in unison, all to be sampled on the same clock cycle. This is what we would expect if there were no significant timing skew, or phase delay. Unfortunately, that may not be the case, particularly for systems that operate at the highest clock speeds, where a likely culprit is differential phase delay that produces timing skew amongst the channels. At high speeds, poor or unwitting choices made during board layout can produce this situation by, for example, imposing differing capacitive loads or by creating differing path lengths. A layout technique that was innocuous at a clock rate of 500 MHz can be fatal at 5 GHz.

Figure 2:
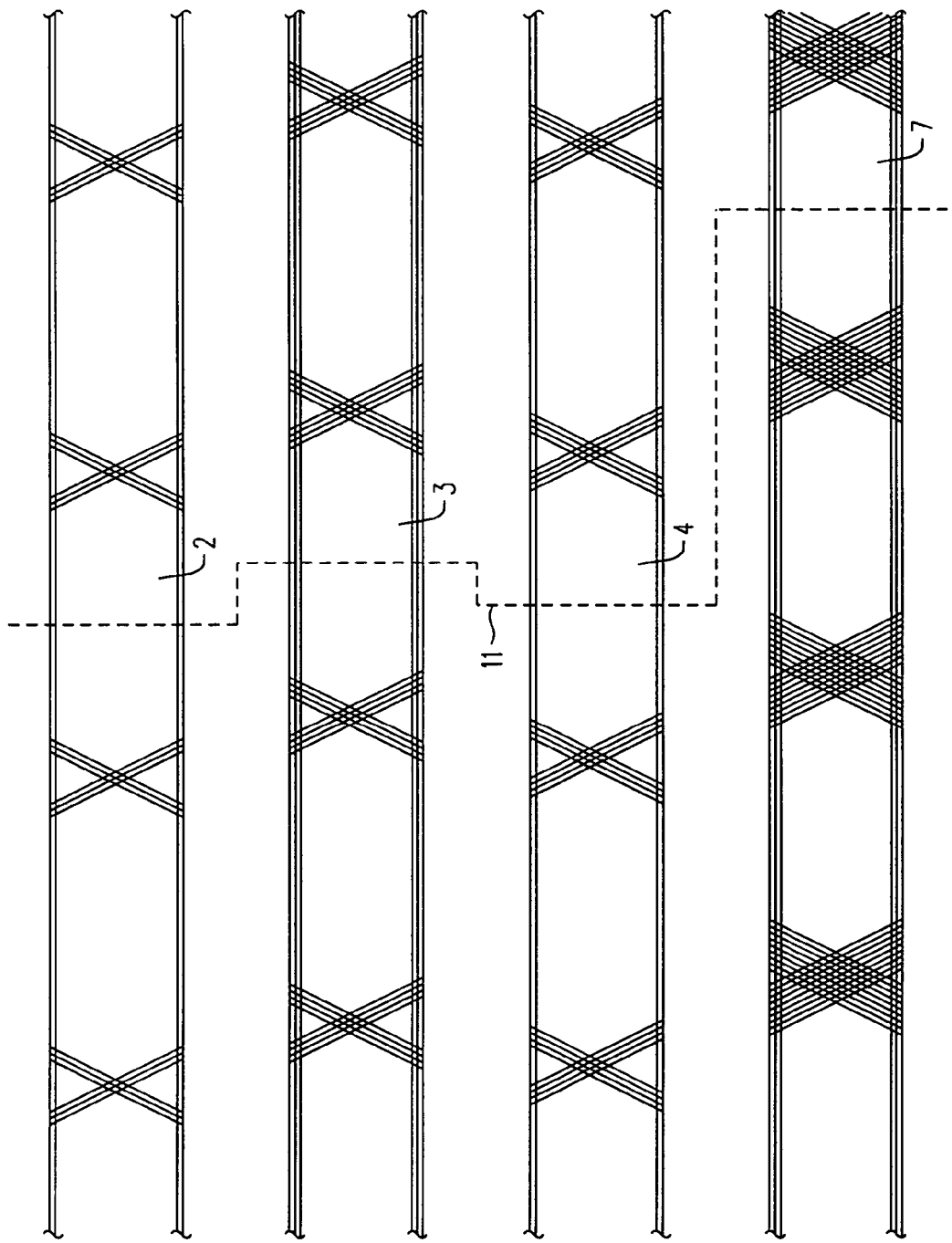
FIG. 2 is an exemplary simplified collection of eye diagrams illustrating certain aspects of timing overlap and the lack thereof.

So, suppose that the collection were the signals whose eyes were 2, 3, 4 and 7. Refer to FIG. 2, and consider the illustration there that is typical of the eye diagram presentation that is often used, where there are several horizontally adjacent eye openings formed as part of each eye diagram. Also suppose that these four eye diagrams are shown one above the other, as in a four trace display on an oscilloscope. The dotted line 11 indicates the true timing relationship between the signals, and we now appreciate that in FIG. 1 eye opening 7 and, say, eye opening 3, correspond to the same clock cycle for different signals, and are NOT adjacent eye openings for the same signal.

So, while it is easy to identify the degree (or lack thereof) of voltage overlap, it is less easy to do the same for timing overlap. For the purpose of simply creating eye diagrams the timing overlap issue can generally be ignored. But for the SUT proper or for a Logic Analyzer camped out on a bus of the SUT this is a vital issue. The examples of FIGS. 1 and 2 clearly show that the phase delay can exceed a Unit Interval (or even more than one). This has real consequences. In the case of an SUT's internal affairs, it would need to know the true amount of phase delay to bring the various bits of the received data into alignment. The Logic Analyzer has the same problem, lest the trace be terribly garbled. Furthermore, in a system where the sample position was constrained to be the same for all channels, then a situation like that presented for eye opening 7 is fatal, just as the (voltage) situation was for eye opening 5. The result of this is that we need to identify (in the language of the incorporated Applications) 'selected' eye openings in each of the signals in the collection, such that those that are selected correspond to one another during any particular clock cycle. This amounts to discovering the phase delay for each of the channels relative to some reference.

There are various ways that this discovery of phase delay might be accomplished. For example, during a training or discovery operation, a known sequence of data can be transmitted and the arriving results interpreted to reveal the phase delay. However it is accomplished, we shall assume that it has been done and that we can with confidence say that each of the eye openings in FIG. 1 is a selected eye opening for a separate signal and that it is to correspond in time to each of the others.

We can now consider the case where a collection of signals is to have a common sample position. Say, the collection included signals whose eye openings were as shown for eyes 6, 2, 3 and 7. We note that the only region of horizontal overlap is the union of regions 8 and 10; region 7 is an outlier, and would have to be excluded. If eye opening 4 were part of the collection, then the overlap is merely region 8.

Eye opening 6 in FIG. 6 is similar to eye opening 7; it is for its own separate signal, and its data arrives earlier than does the data for the signal whose eye is 2.

As we proceed, we shall henceforth assume that lack of timing overlap is as fatal for a channel's inclusion in the process of deciding sampling parameters for the group as is lack of voltage overlap.

To proceed, then, we turn now to descriptions of first and second algorithms for selecting a sampling parameter in the singly constrained case. We shall need some definitions, will need to perform certain preliminary operations.

DEFINITIONS

Sampling Parameters

These are two quantities used as orthogonal axes in describing the behavior of a recurrent signal for which an eye diagram can be made. In the electrical environment of digital signals the sampling parameters are sample position (a time offset from a reference) and threshold (a voltage). In principle they are variable quantities, but in practice, once suitable values are picked they remain unchanged. The values selected for a channel's sampling parameters have a pronounced effect on that channel's performance, and it might not be the case that one set of sampling parameter values is satisfactory for all the channels in a group.

Singly Constrained Case

This refers to a situation where a group of channels are to share a common sampling parameter, which could be either one thereof.

Constrained Parameter

This refers to the sampling parameter that is the common sampling parameter. Its value is constrained in the sense that every channel in the group will use the same value for that sampling parameter.

Unconstrained Parameter

This refers to the sampling parameter that is not forced to have the same value for all channels in the group, and that instead is allowed to vary independently for each channel. In general, each channel will have a preferred value for the unconstrained parameter for any given value of the constrained parameter.

Re-Scaling

This is the changing of an index unit (the tic marks) along an axis that also selects entries in a data structure at tic mark increments. If nothing else is done, once re-scaled, data will need to be interpolated before being placed in a previously existing data structure, or, after being read out, since the new tic marks do not agree with, or line up on, the indexing of the old tic marks.

Re-Sampling

This is the one-time interpolation of data in an existing data structure to transfer it to a new data structure that corresponds to a re-scaling of one or more axes associated with the old data structure.

Normalization

The combination of a particular re-scaling (division of the scale of measured data by either $\Delta T_{min}$ or $\Delta V_{min}$) and arranging that during the re-sampling there are the same number of tic marks per unit of re-scaled axis along each axis. This gives us an easy way to trade the change in margin in one axis off against changes in the other as sample position varies, and comports well with the use of symmetrical shapes such as expanding squares and largest circles to find optimal sampling parameters.

Selected Eye Openings

Eye openings in different signals that correspond to one another, and should be sampled relative to the same cycle of a clock signal.

To forge ahead, let us agree that there are N-many channels in a group that is to operate in the singly constrained case. The eye of interest has been identified for each of the N-many signals of their respective N-many channels. Which of the sampling parameters is to be the constrained parameter is known. For simplicity, trivial issues such as mis-connected leads and mixed logic families are not present (a temporary assumption).

Shown below is a series of numbered steps that form a simplified description of the first algorithm, which we will describe as a sort of bidding system. The analogy is not exact, but it is pretty close. When bidding at an actual auction a bidder bids the lowest price needed to gain the desired lot being auctioned, while raising the bid only as needed and as is affordable. In the first algorithm each channel is a bidder, the desired lot is agreement upon a value for the constrained parameter, and the higher prices are each bidder's agreeing to use choices that are ranked ever lower in order of preference, specific to that bidding channel, and which begin with a first preferred choice. In general, we can't say anything about a channel's first preferred choice, nor about its sequence of ranked bids. That is, the bids might not be adjacent locations along the axis of the sampling parameter that they are associated with. The notion of 'adjacent' brings up another issue. At a real auction all bidders will be required to use a common currency for their bids, and there is often a requirement that bids exhibit exact incremental amounts (which is to say that bids must be integral multiples of some unit amount). So it will be for the bidding performed as part of the first algorithm. (To be fair, the analogy is not correct in this sense: The bids are parameter values expressed in the common unit, but the increasing 'real price,' as it were, is the rising discomfort associated with using a parameter value of lesser desirability. Such 'real prices' are never revealed nor compared—nor are THEY the bids! Perhaps we should liken them to the discomfort a human bidder might feel in a real auction at having to pay more than some desired item is ordinarily worth just to win the bid....)

1. For the group of channels, examine the extremes of the selected eye openings and exclude outliers (no overlap for the constrained parameter) and any other channels the operator may indicate as ones to be ignored. For this discussion it is convenient to assume that a "group" and the channel size of a probe pod are the same, and that the group does not span multiple probe pods. Later, it will be clear that a group could include channels from several probe pods, each pod producing a collection of channels associated with respective (separately) constrained sampling parameters.

2. For the group of channels, decide upon a common coordinate system useable for each channel, and characterized by having an incremental step size for the constrained parameter that is the same size step for all channels in the group. The step size should be one that is realizable by the data receiver hardware. If, for example, the constrained parameter were threshold and the hardware could only step threshold voltage in amounts of ten millivolts, then there is no point in deciding on a voltage axis that has five millivolt steps. Only the constrained parameter need be considered; the unconstrained parameter can be left unchanged, if desired. The coordinate system chosen in this step is thus 'common' in that at least one axis has the same step size.

3. Normalize the eye opening of interest for each channel in the group.

4. Prepare an ordered list of preferred optimal sampling parameter combinations for each normalized eye opening (channel). Here is one way that this can be done.
   a. Let's assume (and by way of example only) that for the normalized eye opening there are twenty different normalized thresholds and fifty different normalized sample positions, for a total of one thousand locations in the normalized eye opening (for the sake of simplicity, temporarily assume that each location is in the eye opening because the eye is a genuine rectangle). But remember that, because of $\Delta T_{min}$ and $\Delta V_{min}$ these locations within the eye opening are not equally desirable.
   b. Now consider the sampling nature of how modern eye diagrams are obtained, along with the idea that some (misbehaving) signals transition within the nominal eye opening, but do so only episodically. The result is sporadic HITs within the eye opening that appear as isolated clusters of locations rather than as an entire path (although if the signal's bad behavior occurs often enough a solid path will be revealed).
   c. Optimization occurs within a normalized eye opening by finding a central point (or points) within the eye that is 'furthest away' from any HITs. Say, by considering all possible interior locations of the eye as trial centers and finding for each the largest circle that fits inside the eye opening without encountering any HITs or exceeding the extent of the eye opening. (We can assume that a boundary of the one thousand locations is formed from other outermost locations that are not part of the eye opening. We could also say otherwise, and that one hundred thirty-six of those one thousand locations are a perimeter that is both boundary and part of the eye opening. Such variations are implementation details about how things are represented, and relate to how an eye opening might be a part of a larger structure, such as an entire eye diagram, or be thought of as existing in isolation.) For each trial center there is a maximum successful radius. The trial center or centers having the largest radius found are optimal preferred locations. Their coordinates are mapped back into those of the original eye diagram, and taken as potential good sampling parameters. We have described this with the use of a circle because it is easy to appreciate; there are other ways of finding optimal sampling parameters for a normalized eye opening. A by-product of this 'largest circle' technique, as well as of a companion 'expanding square' technique (both are described in their full glory in the incorporated "METHOD FOR NORMALIZATION OF AN EYE DIAGRAM AND SELECTION OF SAMPLING PARAMETERS FOR A RECEIVER"), is that we obtain a way to rank the different possibilities that are found: every trial center tried becomes associated with a discovered radius (and larger radii are better). Every location in the interior of the eye opening is used as a trial center, so we have a way to put all the interior locations into an order based on their desirability as sampling parameters (i.e., in descending order starting with the largest discovered radius). The radius (or the diameter) associated with a location is a figure of merit for that location.
   d. "METHOD FOR NORMALIZATION OF AN EYE DIAGRAM AND SELECTION OF SAMPLING PARAMETERS FOR A RECEIVER" deals with individual channels only, and does not consider what to do about groups of channels, nor the notion of the singly constrained case. So, beginning with placing the locations of an eye opening into an order based on desirability (i.e., by figure of merit), we depart the teachings of the incorporated material and head into new territory. (As this ordering is something not needed when considering only a single channel.)
   e. Now assume that there are, say, twenty-five included HIT locations within a particular eye opening, as explained in step (4b). There might not be any, but suppose there are these twenty-five scattered about one end of the eye opening, so that a largest circle has a center that is significantly different from the geometric center of our eye opening (which is usually nowhere near being a rectangle, either). So we have 975 interior locations that were tried as centers, and, say, seven of them have the largest radius, and eighteen have the next largest radius, and so on. We could make a list of 975 comprehensive entries. However, there is a more efficient approach.
   f. Let's begin with knowing which sampling parameter is the constrained parameter. For the particular channel we have been considering, consider those seven locations that have the largest radius. There is a range of possibilities, from the coordinates of all seven locations having the same value of the constrained parameter to there being seven different values for the constrained parameter. Let's say there are three different values. Upon reflection we conclude that we have no way to favor one over the other: they are all equally worthy. We put these three values (in any order) at the top of an ordered list of preferred sample parameter values for the channel we have been considering. Each value is added in the form of a pair of parameters, one of which is the constrained parameter value, and the other of which is the/a best value to use as the unconstrained parameter if the constrained partner parameter were ultimately the one chosen for use. Then we find the constrained parameter values associated with the next largest radius for that channel. As before, we find the different values that occur (suppressing multiple instances of the same value beyond its initial appearance). Next, we eliminate values that are already on the list of preferred values, and put the values that survived (and their best partners) into the next locations of the list of preferred sample parameter values. And so on, until there are no more new values to go into the list. So, we will have an ordered list (according to our example) of at most twenty or fifty paired entries, depending upon which is the constrained parameter. That is a lot better than a list of 975 entries. We do this for every channel in the group, so that for N-many channels we have N-many list of preferred sample parameter values. The entries in each list are in order of most preferred to least preferred.
5. Re-format each channel's list of preferred sample parameter values to be stated in integral terms of the decided-upon common increment of the constrained parameter. This amounts to a normalization operation 'in the other direction' applied to each channel to equip each bidder (see below) with bids expressed in the same denomination. This facilitates the process of determining when all bidders agree by allowing a simple equality check. The alternative is to construe bids that are 'close enough' to be functionally the same. That is a much more messy activity, and requires a rule about how close is close enough.

6. Obtain from each channel's preferred sample parameter values list the top (most preferred) entry for the constrained parameter. We use a sort of bidding process that stops when all parties agree on the results of the bid. So, we put all the bids on a table, and mark them as to who the bidder was. All instances of duplicate bids are removed save one, and the bidder identifications transferred onto that remaining instance. If all bidders appear on one bid, we are done. We have found an agreeable value for the constrained parameter. Otherwise, it must be the case that there is no bid on the table bearing all listed bidders, and we then add to the collection of bids the next entries from the preferred sample parameter lists (one new bid per channel), and continue the checking for agreement. (Old bids are not removed!)

The possibility exists that at some subsequent bid more than one constrained parameter will be seen as agreeable. (We simply cannot predict a channel's sequence of bids. For, say, sixteen channels in a group, after a dozen or so rounds of bidding there might be three different collections of fifteen channels that are each in agreement over three respectively different parameter values. At the next round of bidding all three collections might find the needed sixteenth member.) In this case a secondary selection strategy can be employed, or, we can simply take the first agreement we encounter. The possibility also exists that no agreement is reached until the last possible moment. Having eliminated outliers at the outset, we are (at present, any way) assured of channel overlap within the constrained parameter (and thus ultimate agreement), but if there is not much overlap, then agreement may well be late in coming.

\* \* \* \* \* \* \* \* \* \* \*

We can characterize this first algorithm (as so far presented) as a 'jury system' because everybody has to agree before a selection is made. Fifteen out of sixteen channels might have agreed early on, and repeatedly so for a variety of different values of the constrained parameter, but a lone hold-out channel would be able to thwart the will of the majority until it (the hold-out) eventually offers a value that those other (majority) channels finally agreed to (which is equivalent to the majority finally offering one that the hold-out eventually agrees to). Furthermore, as described so far, there is no easy way to decide if the agreed on selection is a good one, mediocre, or downright rotten. Our interest in secondary selection criteria is also rightfully provoked, as it might be the case that multiple winning bids that emerge at the same step midway through the process are of differing desirability. Still, the 'jury system' algorithm returns a defensible result without too much complexity.

A skeptic might describe the hold-out problem as follows: "Phooey. It's a hostage situation. Fifteen good channels might be forced to operate below their minimums in order to accommodate one defective channel. The result is 'more broken' than if the fifteen were allowed to set the constrained parameter where it ought to be and and the bad channel revealed for what it is. One inoperative channel out of sixteen is preferable to sixteen sick ones!" Hmm. Well, perhaps we should be allowed to pick amongst the poisons offered us, and at least guard against involuntary mass suicide.

An easy to implement improvement to the first algorithm that addresses this view is to modify step (4) above. In step (4c) the locations within the eye opening of each channel were viewed as being in an order based on their desirability for being used as the sampling parameters for that channel. This order was the basis for adding bids to the list of preferred values in step (4f). What we can do is arrange for each channel to decline to add an entry to its list that would force the channel to operate poorly.

Recall that in the optimization step (4c) we used largest circles to find the optimal sampling parameters: they are associated with the center of such a circle. The radius of each circle is express in the normalized units related to $\Delta T_{min}$ and $\Delta V_{min}$. Because of this there is something special about a radius of one, which is the same as a diameter of two. It means that this location meets (but does not exceed) the minimum specifications. The same would be said of an expanding square whose side, s, was of length two.

So, believing that specifications are conservative, and out of a spirit of generosity, we alter each channel's construction of its list of preferred sample parameter values such that it does not add any entries whose figure of merit (diameter or value of s) is less than 1.8. Those who are not so generous and demand that specifications be met can set the minimum radius (or s/2) at one. Those who do not negotiate over hostages and instead send in the SWAT team immediately can set the minimum radius (or s/2) at 1.1 or 1.2 (or even higher). This strategy limits the scope of agreement by restricting the list of preferred sample values to 'respectable' entries only, and forces the bidding process to fail outright rather than pick a value that is unsatisfactory for any bidding channel.

Here is some philosophical motivation for the urge to be generous. Suppose that we have several channels that have largest circles of radius three. We admit that this is certainly comfortable. And if the price of getting one or two other channels moved from operating at a radius of one half to operating at a radius of one is moving the several channels from a radius of three to two and a half, well, that seems a good bargain. But suppose the several had to be moved all the way to one, and for that trouble the other channels only moved up to point nine. Is that worth it? Well, perhaps it is. Think of it like this: How many times can a condemned man be executed? How much better than a radius of one is a radius of three? Is there really any observable difference in behavior? (Maybe there is. The BERT (Bit Error Rate Tester) people might interject here to inform us that the predicted error rate goes from, say, $10^{-12}$ to $10^{-14}$. We might have to decide if that is important enough to act on. But perhaps other factors swamp that improvement out, so that the real answer is determined otherwise.) So, if there is a significant difference, then perhaps we need to alter how we understand a radius (or s/2) value of 'one.' If not, then we should simply decide that there is no point in executing a corpse, and take the value 'one' at face value (perhaps while wishing we could afford a larger value) and accept the compromise.

And as for the issue of an overall confidence indicator, that also has a fairly easy to implement solution. In step (4f), suppose instead of adding pairs to the list of preferred sample parameter values we added triples. The extra element is the diameter of the associated circle (or its radius) or the side s of the associated square (i.e, a figure of merit). Alternatively, the third element might be a letter grade, assigned as follows: Let I be either the radius or s/2. Then assign a grade of C (acceptable) when $1.0 \leq I < 1.5$. There are also values that are better than merely acceptable, and some that are worse. So, when I falls within the range $1.5 \leq I < 2.0$, and assign those cases a grade of B (good), and those cases where I falls within the range $2.0 \leq I$, (grade A, very good). Likewise, those cases where I falls within the range 0.5≦I<1.0, assign a grade of D (poor), and where I falls within the range 0.5>I, a grade of F (terrible).

Now, when the constrained parameter is agreed upon, we can also simply average supplied third elements and show that as a confidence indicator. One the other hand, averaging six As, eight Bs a C and an F might be rather like telling a world class runner "Well, you are in really great shape, except for how your leg got crushed in the accident. . . ." How many fatal flaws does it take to cause fatality? As for confidence indication, it might best if it were performed at the channel level, rather than at the level of entire groups.

The question of what to do when the singly constrained case needs divergent values (no agreement) remains to be dealt with. One way to deal with the case when there is no agreed upon constrained parameter is to simply 'bite the bullet,' as it were, and operate the system at whatever acceptable value of the constrained parameter offers the greatest number of channels in agreement. To do that we add some more stuff to step (4f):

At the first bid where there is some agreement, we note if it is for all channels. If it is, then everything is fine, and the recommended value for the constrained parameter has been agreed upon. If it is for less than all channels, and there is still more bidding possible, then we make an entry in a bidding history describing a collection of how many channels are in agreement and for what parameter value. Ordinarily an entry can describe a single collection if it is the only collection or if it has more channels than any other collection. But if a bid produces different collections with the same larger number of channels, then we should put them each in the bidding history. At the next bid for which there is some agreement we leave the bidding history alone unless the number of channels in agreement is larger than before, in which case we update the bidding history. When no further bidding is possible and no agreement has been reached among all channels, then use as the constrained parameter the/a stored parameter value most recently saved in the bidding history, and inform the operator that something is amiss (i.e, there are one or more hold-out channels).

This additional strategy will preserve the largest partial consensus, even though it never became a total consensus. So the following scenario might occur: There are sixteen channels. Suppose the constrained parameter is threshold voltage. After several bids there are five channels in agreement upon a proposed voltage of 2.0 volts. If this is the first instance of an agreement among any five channels, then five channels and 2.0 v go into the bidding history. Later, there are nine channels in agreement upon 1.8 volts. If this is the first instance of an agreement among any nine channels, then 9 ch's and 1.8 v go into the bidding history. Then there might emerge for the next bid a different collection of nine channels in agreement over 1.7 volts. This would not be recorded in the bidding history, on the theory that the most desirable values for each channel are being bid first. While agreement among nine channels upon a satisfactory value is better than agreement among seven channels, the second instance of agreement among nine (for a subsequent bid!) is not better than the first, and the first instance should be saved until replaced by a satisfactory agreement among a larger number of channels. Why? That agreement among the first collection of nine might be needed if nine were as high a number of channels that reached agreement.

Figure 3:
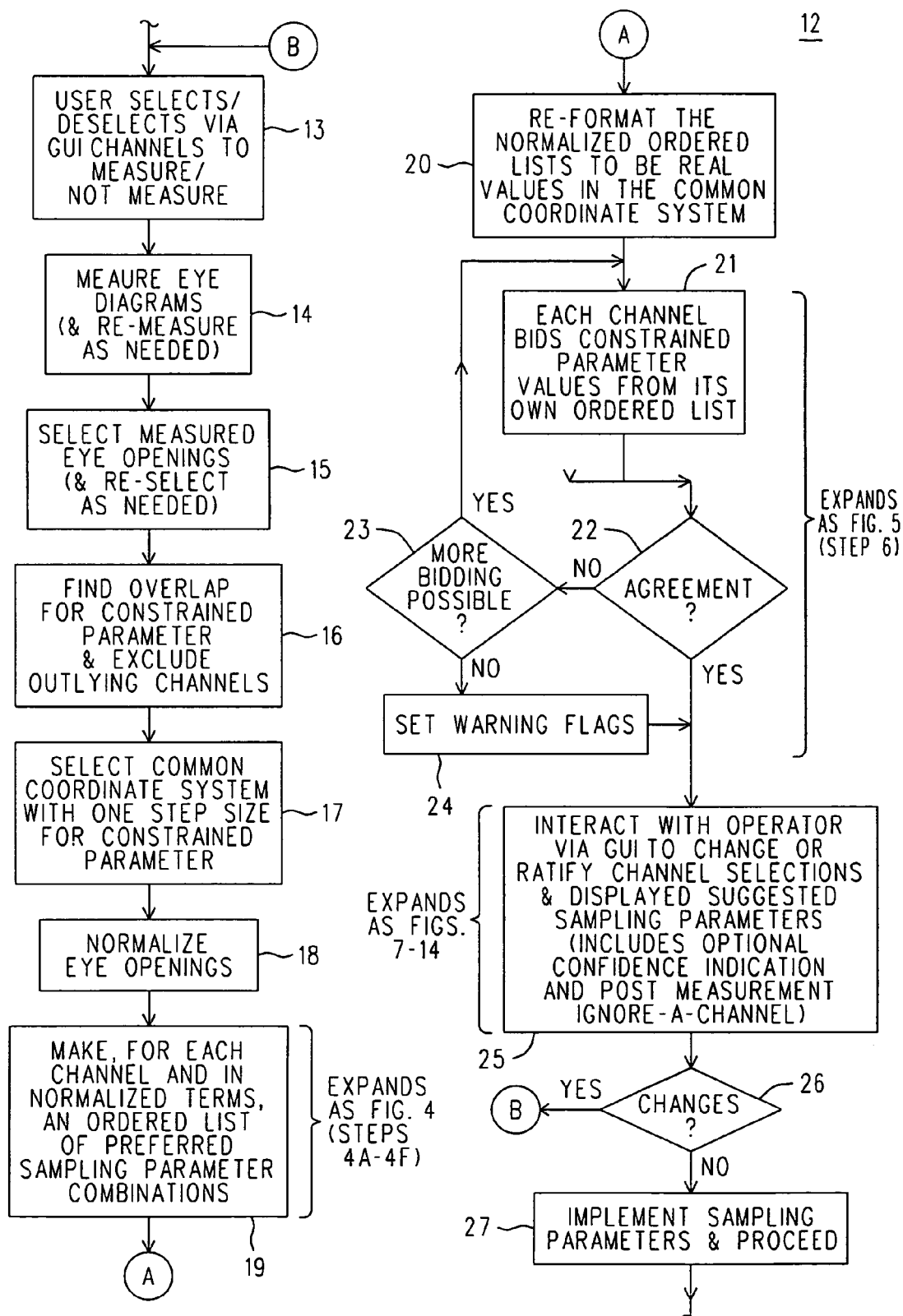
FIG. 3 is a simplified overview flowchart describing a first algorithm for selecting an optimum value for a singly constrained sample parameter for a collection of channels.
Figure 4:
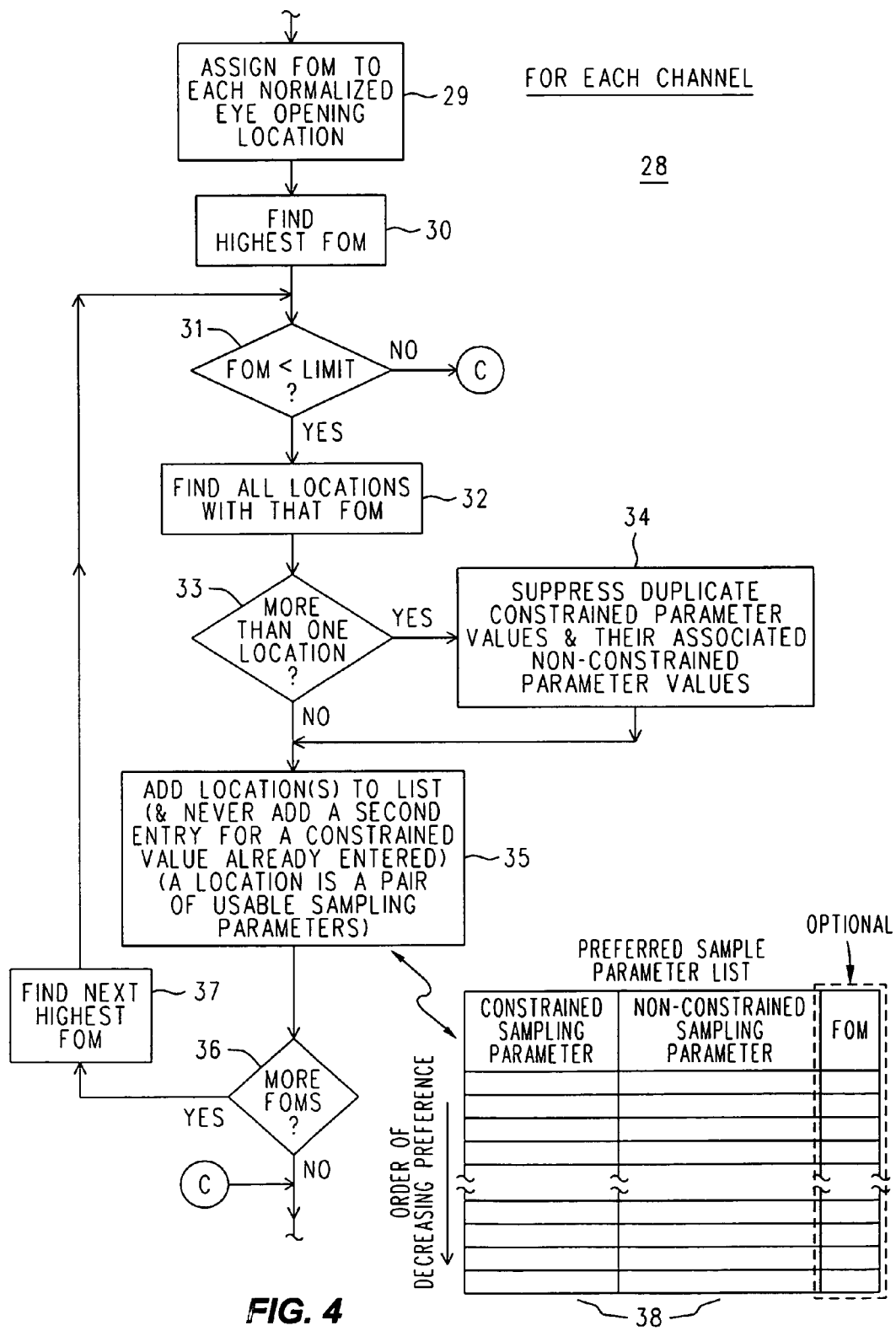
FIG. 4 is a simplified flowchart describing an expansion of a list preparation step in the flowchart of FIG. 3.
Figure 5:
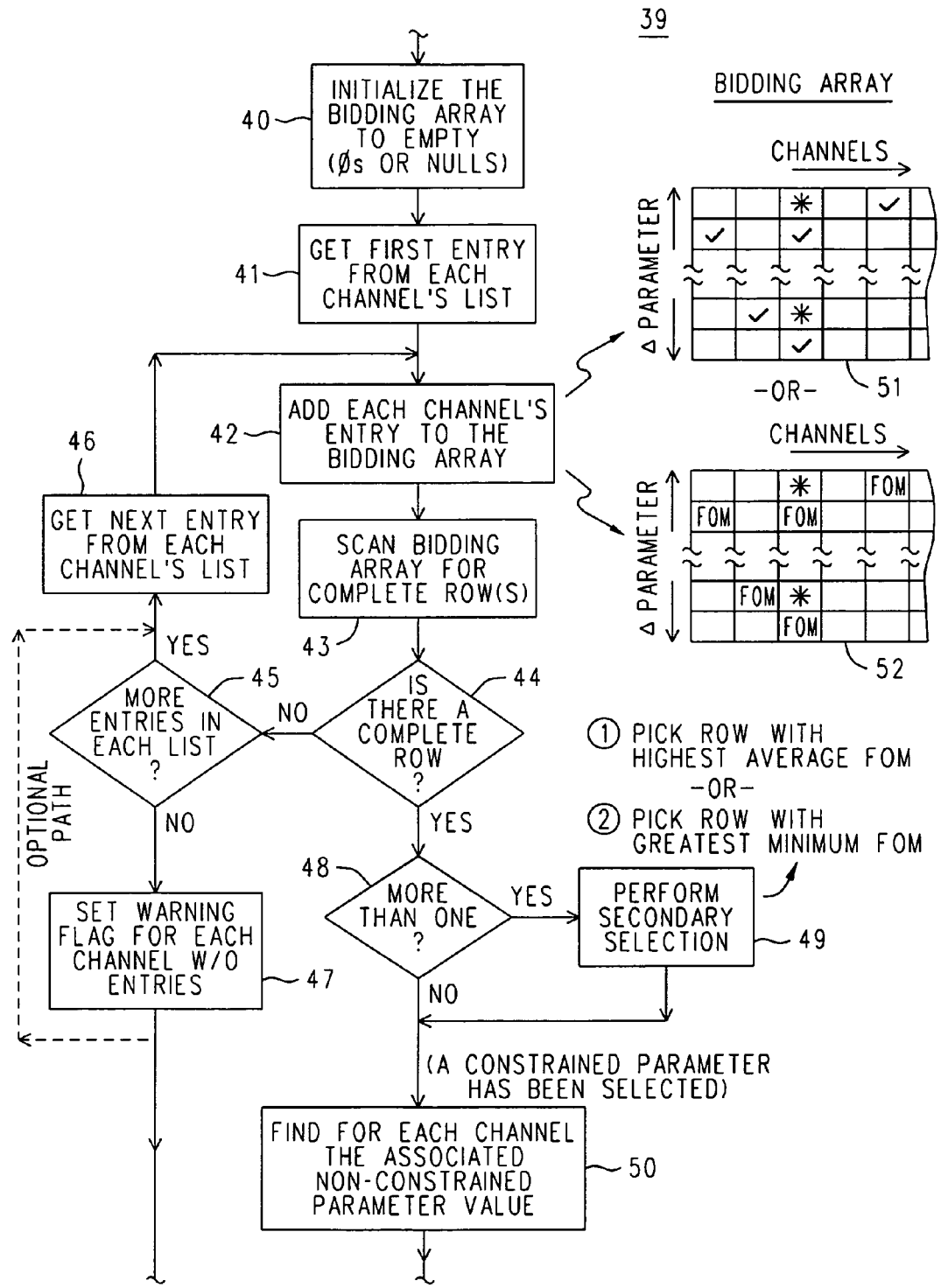
FIG. 5 is a simplified flowchart describing an expansion of a bidding step in the flowchart of FIG. 3.

A collection of simplified flowcharts for the first algorithm is shown in FIGS. 3-5. In light of the extended description given above for the first algorithm, and of the annotations within the flowcharts themselves, they are believed to be largely self explanatory and without need for extended detailed description. Accordingly, we shall discuss them only briefly.

FIG. 3 is an overview flowchart 12 of the first algorithm, and includes many of the modifications over and above the basic 'jury system' of the original steps (1)-(6). Referring now to the flowchart 12, at step 13 the user or operator of equipment incorporating the method of selecting optimum sampling parameters for a plurality of data receivers having a constrained parameter (at least one sampling parameter in common for the plurality) selects and/or de-selects via a GUI (or other suitable interface) particular channels to be included/excluded in eye diagram measurements. The equipment might be a Logic Analyzer, such as the 16754, 16760A and 16910A Logic Analyzers from Agilent Technologies, which equipment not only exhibit the constrained sample parameter property (common thresholds per probe pod) but may also be equipped to perform eye diagram measurements.

At step 14 the eye diagrams of the selected channels are measured. In the event that subsequent changes are made to the channel selection decision, the flowchart 12 is 're-started' and when step 14 is reached again, it allows for a re-measurement of channels now needed but not yet measured. Of all the activities associated with the flowchart 12, the measurement of eye diagrams is the most time consuming, and care is taken to not re-measure eye diagrams for any channels whose previously measured eye diagrams remain applicable.

After the eye diagrams are measured, step 15 is the selection of the 'selected' eye openings ('selected' as in the terminology of the incorporated "METHOD FOR SELECTING AND EXTRACTING AN EYE DIAGRAM OPENING FOR SUBSEQUENT PROCESSING" and of FIG. 2, and is not to be confused with the including or excluding of an individual signal for a group). This operation, too, is subject to a re-selection as needed in the event of changes made after a 're-start' of flowchart 12.

At step 16 the selected eye diagrams are examined for overlap in the dimension of the constrained parameter. Outlying channels (those that do not share an overlapping region formed by a collection of other channels) are flagged for exclusion. If desired, a more stringent minimum degree of overlap may be enforced that is larger than the bare minimum of simply one location within the eyes.

Step 17 is the selection of a common coordinate system for the axis of the constrained parameter. This common coordinate system shares, among all channels, a selected step size for that axis. This has two effects. First, it arranges that the different FOMs (Figures Of Merit) that are to be found (explained in connection with the expansion in FIG. 4 of the next step, step 19) are relative to the same increment, regardless of channel, and are thus commensurate. Second, it ensures that the bids will be multiples of a common increment. This not only makes a determination of bid agreement easy (we needn't form ranges and check for their overlap), it also means that the FOMs that are associated with the bids are exact. That is, we are going to order things by FOM, and we will only discover those FOMs that are at locations formed by the step size. If we were later forced to consider an increment of another size we cannot legitimately interpolate the FOM. (To see this, consider how a largest circle centered on a location behaves as it expands and there are interior locations included in the eye opening. FOM is not obligated to be either linear or continuous as a function of position along an axis.) The selected step size is not critical, as things go, but should not be so large as to obscure desirable resolution, nor so small as to incur unnecessary arithmetic overhead.

Step 18 is to normalize the selected eye openings. This operation is described in the incorporated "METHOD FOR NORMALIZATION OF AN EYE DIAGRAM AND SELECTION OF SAMPLING PARAMETERS FOR A RECEIVER," and involves the idea (for each channel) of a common number of steps in each normalized axis (for that channel). A re-sampling is used to achieve this. As set out in "METHOD FOR NORMALIZATION OF AN EYE DIAGRAM AND SELECTION OF SAMPLING PARAMETERS FOR A RECEIVER" it does not particularly matter if the original sampling of the two axes are both changed to result in a common number of steps that neither had before, or that all the change was effected in the step size of one (normalized) axis to produce a number of steps that match the number of steps in the other. Here, in the multi-channel case, we want the axis for the constrained parameter to retain its commonality across all channels. That the range of values for the constrained axis is the same for all associated channels follows easily from there being the common hardware that is at the heart of the singly constrained case. But each channel's eye diagram is normalized individually. If we were not careful, we might accidentally produce different step sizes for each channel's constrained axis, which means a different number of steps. To allow this would introduce much mischief into the bidding process! Accordingly, at this normalization step 18 we prefer that, for each of the channels, there is a common number of steps for the normalized constrained axis for each channel and that within each channel the burden of producing the same number of steps in each normalized non-constrained axis be borne by individual adjustments within the non-constrained axes of the respective channels.

Once the eye openings are normalized, step 19 of flowchart 12 (which corresponds to steps 4A-4F of the first algorithm) is the creation for each channel of a respective ordered list, in normalized terms, of preferred sampling parameter combinations. The ability to do this arises from applying the techniques of the incorporated "METHOD FOR NORMALIZATION OF AN EYE DIAGRAM AND SELECTION OF SAMPLING PARAMETERS FOR A RECEIVER," and using the size of the largest circle or largest expanded square for each location in the eye opening as a Figure Of Merit for those locations. The ordered list of step 19 is in the order created by those resulting FOMs. We shall later expand this step (19) in connection with FIG. 4.

To continue with FIG. 3, step 20 is to re-format the normalized lists found at step 19 to be in terms of the 'real' values of the common coordinate system set up in step 17. This is preparation for the bidding of step 21, and it will be appreciated that the common step size for the constrained parameter reappears. If it didn't, then determining agreement among bids would be a messy process, indeed.

Step 21 is the beginning of a bidding process (steps 21-24 of flowchart 12 and corresponding to step 6 of the first algorithm) that is shown in more detail in connection with FIG. 5. Collected bids are checked for agreement at qualifier 22. If there is agreement, then step 25 is next, else qualifier 23 asks if more bidding is possible (i.e., has any channel run out of bids?). If more bidding is possible, then step 21 is repeated. Eventually, there will either be agreement (YES) at qualifier 22 or no more bids will be possible (NO at qualifier 23). Agreement leads, as before, to step 25. A NO at qualifier 23 causes some warning flags to be set that identify the channel(s) that is(are) the 'holdout(s)' or that is(are) otherwise impoverished in the bidding department, so that the interaction with the operator at step 25 can be one that is properly informed.

Step 25 of the flowchart 12 is an interaction with the operator via a GUI that allows either ratification of selections and their results, or changes. The nature of this GUI is the subject matter of FIGS. 7-14, and will be discussed below and in due course.

Qualifier 26 enquires if there have been any changes that require re-execution of a portion of the flowchart 12. If there are, then the YES branch from qualifier 26 leads back to step 13, where needed operations are re-performed on an as needed basis, as previously explained.

If there are no changes, then the NO branch from qualifier 26 leads to step 27, where the discovered and recommended sampling parameters are implemented, and instrument operation proceeds (e.g., the specification and measurement of a trace by a Logic Analyzer).

Now consider the segment of flowcharting 28 depicted in FIG. 4. It is an expansion of step 19 of FIG. 3, is performed for each channel being considered, and begins with a step 29 where a Figure Of Merit (FOM) is assigned to each location in the normalized eye opening of a channel. This might involve the use of an intermediate table of locations versus FOMs, and the finding of those FOMs may be accomplished as described in connection with step (4) of the first algorithm. This is easily seen as a byproduct of the optimization described in the incorporated "METHOD FOR NORMALIZATION OF AN EYE DIAGRAM AND SELECTION OF SAMPLING PARAMETERS FOR A RECEIVER." The idea is that the optimization technique ranks locations according to their desirability as sampling parameter values. For example, the expanding square technique and the largest circle technique both have a size associated with each location in the eye opening. The size may be taken as the FOM, with larger sizes representing better FOMs. It is true that this kind of FOM is based on being able to vary both sampling parameters, while we are concerned here with a singly constrained case, but we shall show how we can use it anyway.

At step 30 the highest FOM is found. This is the top entrance to a loop that will store the different FOMs in order of descending value. The next step in the loop is the qualifier 31, which asks if the FOM just found is less than some limit (or, less than or equal to some limit, or, at least equal to some limit, etc.). The idea is that a limit can, if desired, be selected to require that the FOM be large enough to indicate at least basic bare usability of the associated location. This feature allows clearly unsuitable locations to be discarded immediately, saving overhead. For the particular logical relationship indicated in step 31, this feature can be disabled by setting the limit value at zero.

Step 32 is to find all (normalized) locations having the current FOM. There will be at least one, but there might be many. This is identified by qualifier 33, and if there is more than one location (YES), then step 34 allows a consolidation of information. It does this by suppressing duplicate constrained parameter values and their associated non-constrained parameter values. So, let's say that there were thirty-two different locations associated with a given FOM. These might be four different constrained parameter values, each having eight associated non-constrained parameter values. This is four families. We select, within each family, just one of the locations therein to represent the entire family. In this view, each location within such a family associated with a given FOM is as desirable as any other, since that is what we expect the FOM to mean. If it really does mean that, then we cannot decide in favor of one member of the family over the others. Pick one. (For those who are tempted to think that further selection upon the non-constrained parameter value might be productive, say a preference for one furthest from any boundary or eye diagram limit, they are reminded that there are also apt to be 'inclusions' within the eye opening that are not separately listed for easy identification, and that optimization process has already taken both possibilities into account. Evidently, since the FOM came out the same, such considerations did not make any difference . . . . ) So, if there were four families for a given FOM, then step 34 would select four locations, one from each family, to represent those four families.

Step 35 is the addition of the one location (NO at qualifier 33) or of the one or more locations from step 34 (YES at qualifier 33) to a preferred sample parameter list 38. An entry in the list is a usable pair of sample parameters (one constrained, one not) that are associated with each other by being a location that produced the current FOM. It is preferred that the FOM be added to the list 38 as well, although that is, in principle, optional.

Now, it is quite possible that as other (lower) FOMs are subsequently considered a value of constrained parameter value will be presented to step 35 that is one that has already been entered in the list 38. Upon reflection, it will be appreciated that this proposed entry into the list can be declined. Why? Because the previous entry is for the same constrained value, and it (the earlier entry) has a better FOM!

Qualifier 36 asks if there are more FOMs to consider. If YES, then step 37 finds the next highest and returns to the top of the loop at qualifier 31. If there are no further FOMs to consider the NO branch from qualifier 36 is the end of the flowchart segment 28.

FIG. 5 contains a flowchart segment 39 that is an expansion of steps 21-24 of the flowchart 12 of FIG. 3. It describes the bidding process, and begins with a step 40, where a bidding array is initialized (say, to all zeros or to all nulls). The bidding array (51 or 52) is used to record channel bids by value so that they can be inspected to discover agreement among the channels.

The bidding array can be two dimensional, with one dimension indexed by an ordinal value ranging over the number of channels of interest, and the other indexed by an ordinal representing the various constrained (real, non-normalized) parameter values that might occur (i.e., ones drawn from the common coordinate system with one step size selected in step 17 of the flowchart 12 in FIG. 3). Another way to think of it is that the different values of the ordinal indexing the constrained parameter values of the bidding array corresponds to the various ordered entries in the preferred sample parameter list 38 in FIG. 4. Those entries are a sample parameter pair with an optional FOM, and the order of those entries corresponds to the consecutive values of the ordinal for the bidding array. (Beware. While there will always be a first, second, third, fourth, etc., entry in the list 18, not every multiple of the step size in step 17 need be present, and those that are present might not occur in a strictly monotonic fashion relative to their neighbors.)

Step 41 is the top of a loop that performs the bidding, and gets each channel's initial bid from (first entry in) that channel's preferred sample parameter list (18).

Step 42 is a bidding step where each channel's bid is recorded in the bidding array. There are two general ways in which this can be done. In bidding array 51 a mark of some sort, perhaps simply one bit (and shown as a simple check mark √) is stored at the locations corresponding to the channel-constrained parameter combinations. Presumably each column (as shown with channels indexing the columns) will receive a check mark at the level of some row, but the rows needn't be the same. That simply means the different channels have not yet agreed on a constrained parameter value.

What is different about bidding array 52 is that the check mark is a non-zero or non-null actual FOM. This latter form 52 of the bidding array is preferred. The asterisks shown in the arrays pertain to an optional manner of handling a failure of the bidding process, and are discussed later.

Step 43 is the scanning of the bidding array (either 51 or 52) to discover with qualifier 44 if there are any complete rows of entries (either check marks or non-zero/non-null FOMS). If there is a complete row, then bidding has been successful, and a YES branch from qualifier 44 leads to qualifier 48 which asks if there is more than one such row. That won't happen on the first bid, but it could any time thereafter. That is, upon the twentieth bid there might three rows that are finally complete. They will not all be for the same FOM, and will corresponds to three different values of the constrained parameter. That is, one channel's fourth choice might have to be taken in conjunction with another channels sixth choice, and so on. A YES branch from qualifier 48 leads to step 49 where secondary selection is performed to pick which of those (in this example) three values to use as the constrained parameter (since a channel can't have more than one threshold or sample position at a time . . . ).

There are different ways that such secondary selection can be performed. We prefer ones that are based on the FOMs of the various locations that comprise each complete row. One way is to pick the row that has highest average FOM, and the other (which is what we prefer) is to pick the row with the greatest minimum FOM.

After either a NO branch from qualifier 48 or the performance of secondary selection at step 49, the next step (50) is to find, for each channel, the associated non-constrained parameter value. With this, each channel now has a complete specification of its sampling parameters, one of which is constrained according to the singly constrained case.

We now consider the NO branch from qualifier 44. The ususal way this happens is when there simply have not been enough bids yet to reach agreement. In that case, the answer at the next qualifier (46-MORE ENTRIES IN EACH LIST?) is YES, which leads to step 46 where each channels next bid is obtained. At that point the bidding loop resumes with another execution of step 42 (described above). However, it might happen that no agreement has yet been reached (NO at qualifier 44), and there is at least one channel whose list has been exhausted. This is the NO-at-qualifier 45 situation. In the larger view of things, this means that bidding has failed to produce agreement. There are at least two general ways to handle this situation. Each involves setting one or more warning flags that describe the circumstances, which is what step 47 is for.

The first way is to simply terminate the bidding and let step 47 transition to the next step: INTERACT WITH OPERATOR VIA GUI . . . (25 in FIG. 3). In this case the relevant difficulties are made known via the GUI and the operator makes an appropriate response, which could appear as CHANGES with a YES at qualifier 26.

A second approach to a failed bidding process is to disregard a channel that has run out of bids and see what a resumed bidding process produces. There are various ways that this can be accomplished, and we shall sketch one. Suppose the SET WARNING FLAG step (47) amounted to or additionally included storing a 'particular indication' in the bidding array (51/52), after which the dashed option path leads to step 46.

As an example of how this 'particular indication' might be obtained, notice the asterisks columns of bidding arrays 51/52. In this example we use the asterisk to indicate in a general way that the associated channel was the cause of a NO at qualifier 45, and their locations denote parameter values that could not be bid. (The drawing needs a symbol, and we picked an asterisk; many other suitable indications are possible.) A related modification is that the qualifier 44 (IS THERE A COMPLETE ROW?) operates such that an asterisk appears, as far as qualifier 44 is concerned, to be an entry (lest we get stuck in the bidding loop with no way out . . . ). Step 50 (finding the associated non-constrained parameter) and perhaps also step 49 (secondary selection) would show the appropriate respect for the asterisks (e.g., ignore them and propose a constrained parameter value in their absence). As in the other case, step 25 (INTERACT WITH OPERATOR VIA GUI . . . ) will give the operator the chance to ratify the result or make any other needed response.

It is clear that there are a variety of ways besides the 'asterisk-mechanism' that might be used to steer this second case in response to bidding failure, some of which might involve a change in the size or structure of the bidding array, or the creation of additional auxiliary arrays. Furthermore, the asterisks (or some other counterpart indication) might originate as part of step 46, or as some other separate step.

It will be appreciated that the "each channel" mentioned in the flowcharts of FIGS. 3-5, and within their respective descriptions in the text, refers to each channel in a group of channels that make up an associated singly constrained case. For example, they might be the channels of a probe pod that provides only a single threshold for the channels served by that probe pod. It will further be appreciated that, in such a case, if there were more probe pods, then there would actually be as many different singly constrained cases as there were probe pods, and that the activity of the first algorithm/FIGS. 3-5 would be performed (at least in part) once for each singly constrained case. Certain of the activities could be performed "once," since they are not closely associated with a constrained parameter; e.g., steps 13-16, 18, and 25-27 of FIG. 3. On the other hand, steps 17 and 19-24 are ones that need to be performed individually as part of their associated singly constrained case. In this same vein, it is preferred that there be a separate bidding array for each instance of a singly constrained case.

Figure 6A:
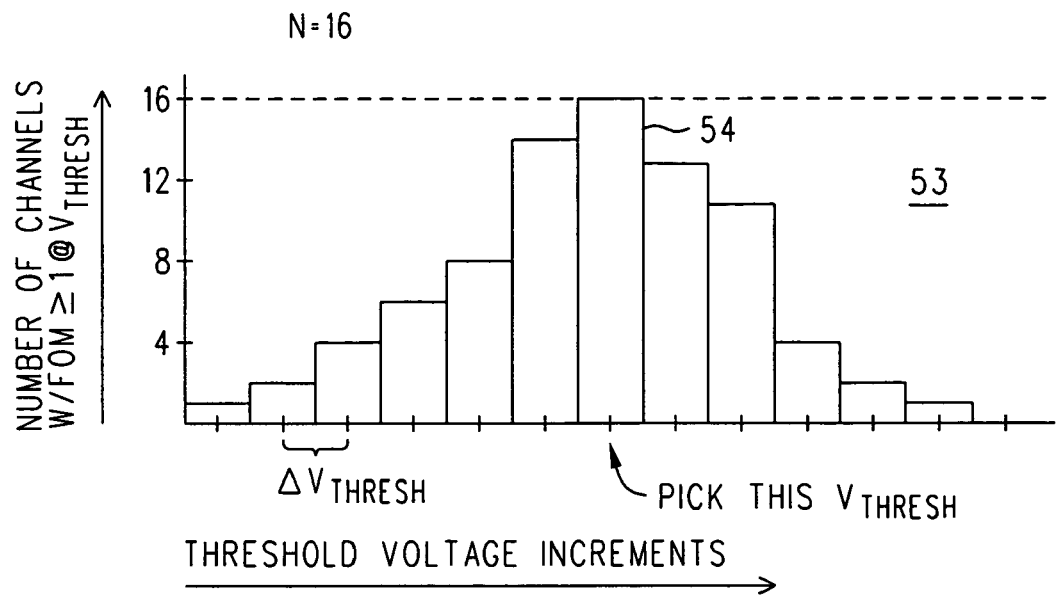
FIGS. 6A and 6B are sample histograms associated with a second algorithm for selecting an optimum value for a singly constrained sample parameter for a collection of channels.
Figure 6B:
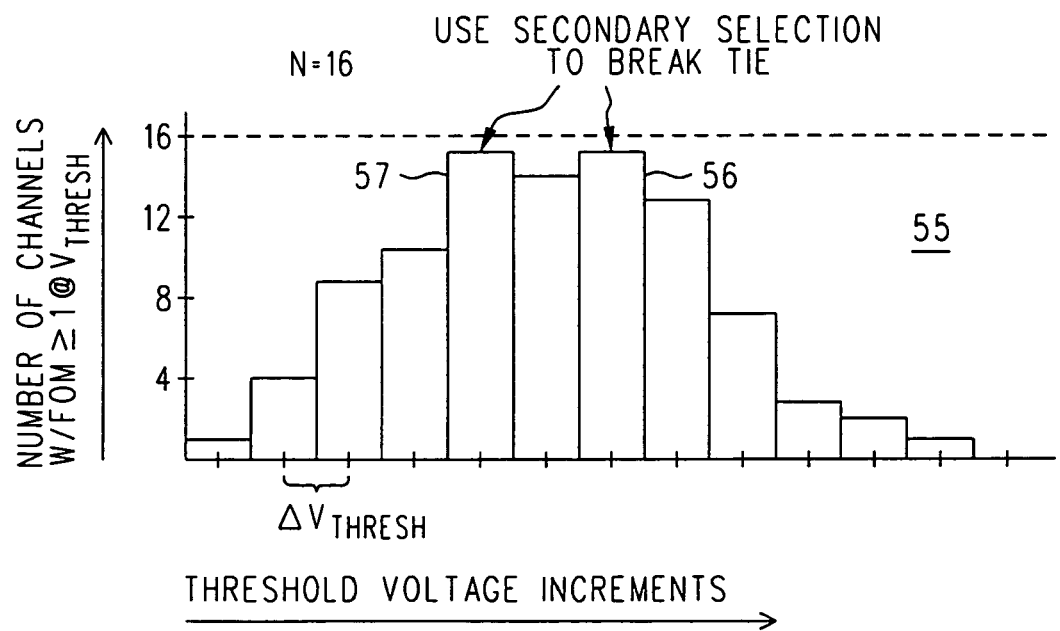

With an understanding of the first algorithm in mind, we are motivated to consider a second algorithm for the singly constrained case that surveys the overall situation for a group of channels by forming a histogram that identifies a majority position as well as any 'hold-outs.' In terms of outcomes, the second algorithm is essentially the same as the first algorithm, but it differs significantly in its operation. A pair of example histograms for the case where threshold voltage is the constrained parameter is shown in FIGS. 6A-B, and pseudo code associated with their production and interpretation is shown in APPENDIX "A" (which also assumes that threshold voltage is the constrained parameter). The pseudo code of APPENDIX "A" contains many comments, and if the first algorithm is understood then the second is not difficult, as many of the same concerns are addressed.

There are some things that we wish to point out about the histograms of FIGS. 6A-B, however. FIG. 6A represents a relatively simple case. There are sixteen channels that are part of the singly constrained case represented by the histogram 53. One cell (54) of the histogram has a (maximum) value of sixteen, and it is centered over some threshold voltage value indicated by the arrow from the legend PICK THIS $V_{THRESH}$. We can see that on the left side of the cell 54 is another cell representing fourteen channels at a different threshold voltage, while on the right side is one representing thirteen channels at yet another threshold voltage. Might all three of these cells have an amplitude of sixteen? Or five consecutive cells? Yes, in which case secondary selection is required, and it might not then be the case that the most central cell represents the best choice, although it could. It could also happen that cells having maximal values are not adjacent.

The pseudo code of APPENDIX "A" has a section devoted to secondary selection. It is essentially equivalent to the secondary selection described in connection with step 49 of flowchart 39 in FIG. 5 described earlier for the first algorithm.

We can assume that the horizontal axis of the histogram places the various threshold voltages in their natural order, say, from least on the left to greatest on the right. We note also that the vertical axis (ordinarily) requires that a channel have an FOM that is at least one in order to contribute to the amplitude of a cell. However, in the case where a channel has no threshold with an FOM of at least one, then the threshold for that channel which has the best FOM is allowed to contribute to the cell of the histogram representing that threshold voltage.

FIG. 6B is like FIG. 6A in most ways, except that it might be for a different group of channels. It is a histogram 55 that has two peaks 56 and 57, neither one of which represents all sixteen channels, and which are not adjacent cells. In this case secondary selection is definitely required. Note also that cells 56 and 57 are separated by a cell with a lower amplitude. The threshold voltage for that lower amplitude cell might actually be a really good value for most of the channels, but really bad for two of them. If the amplitudes of cells 56 and 57 are fifteen, then the histogram 55 shows that only one channel is an outlier if one of the thresholds corresponding to cells 56 or 57 is selected (sixteen minus fifteen is one). Of course, cells 56 and 57 could both have amplitudes of sixteen.

Figure 7:
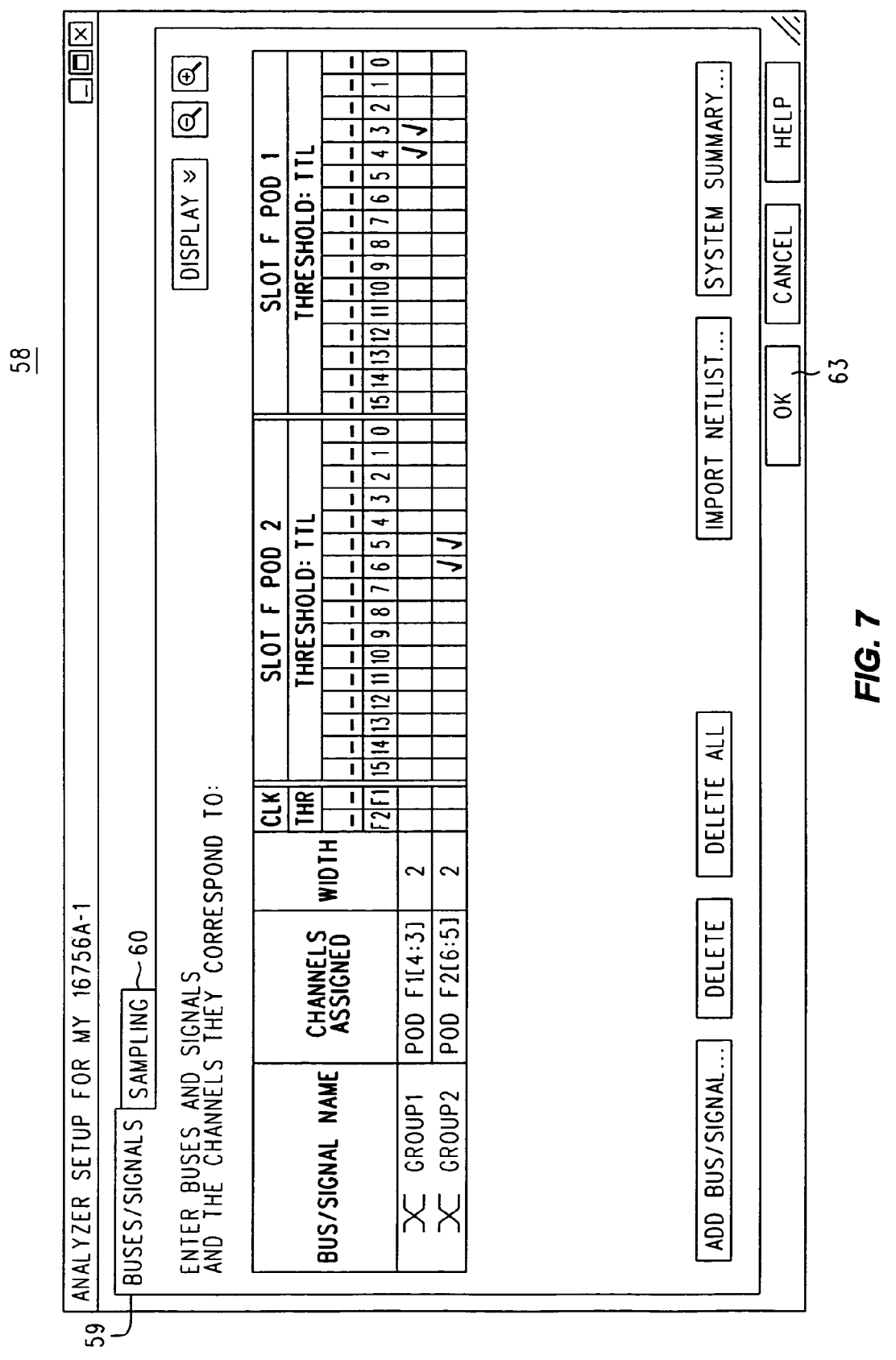

We turn now to a user interface implemented as a GUI that may be used to monitor and control one or more instances of one of the singly constrained sampling parameter selection processes just described. In particular, FIG. 7 is an ANALYZER SETUP screen 58 having a BUSSES/SIGNALS tab 59 (in front, and thus visible) and a SAMPLING tab 60. The operator of a Logic Analyzer uses the BUSSES/SIGNALS tab 59 to establish the correspondence between labels assigned to collections of busses (and signals) and the probe pod/channel combinations that are connected to those collections of busses (and signals). In the example shown in FIG. 7 a bus of two bits is named GROUP1 and originates as channels three and four of pod one in slot F. Likewise, GROUP2 originates as channels five and six of pod two in slot F. Both pods have been given (temporary) default threshold settings that are suitable for TTL family parts. It will be noted that in this Logic Analyzer environment each probe pod has a common threshold for its channels. Accordingly, GROUP1 and GROUP2, which use separate probe pods, are each an instance of a singly constrained case. It will be appreciated that we have kept this example simple. A more realistic example would be for GROUP1 to be thirty-two channels over two probe pods, with the same for GROUP2. Then there would be four instances of singly constrained cases for the two collections. If we were to attempt to proceed with such a large example the incremental benefit would be small compared to that of the present simple example, while the damage to the drawings would be outstanding.

Even the two thirty-two channel cases mentioned above do not rise to the full level of logical complexity that is possible. Suppose, for example, that the case we do show in FIG. 7 were extended by adding channel 3 of pod 2 to GROUP1. It can be done with a simple check mark in screen 58. Now GROUP1 would contain three channels and would not have just a single constrained threshold, but would instead have two, one of which was the same as for GROUP2. The reader should appreciate that there may be many probe pods and many signals, and that there are alternate (and perhaps overlapping) definitions of groups that can be made to accommodate different modes of SUT operation, and that some signals might be "strange" as to their levels, but owing to practical limitations various signals will need to be serviced by left over inputs on probe pods previously used for other parts of the setup. The point to keep in mind is that the scope of the constrained sampling parameter is not necessarily influenced by how channels are grouped for logical convenience. In particular, in some Logic Analyzers the probe pods are at the root of constrained thresholds, and that influence is totally independent of how channels are grouped for functional analysis of the logical behavior of their signals.

Figure 8:
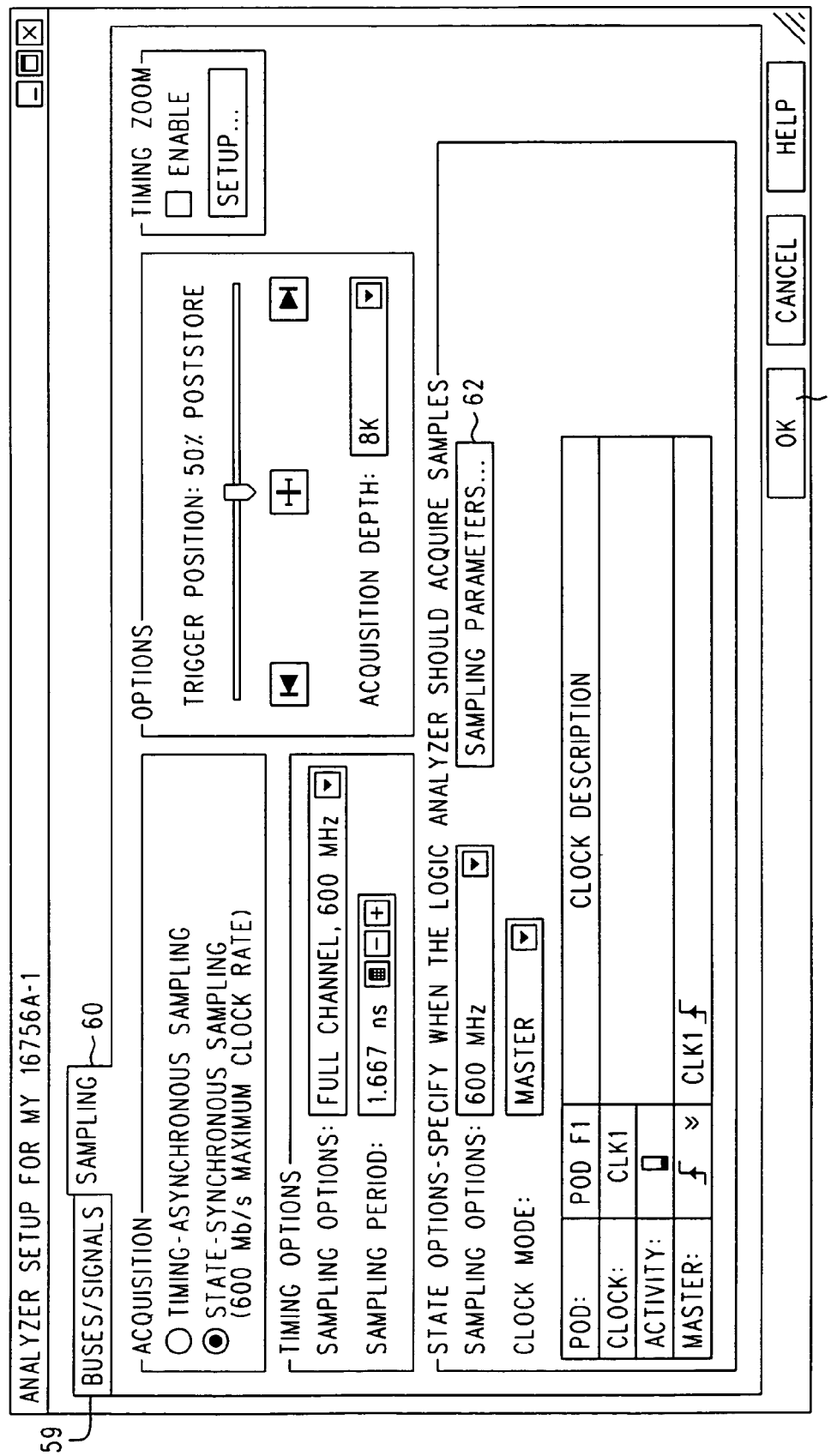
FIG. 8 is a simplified depiction of a screen of a Logic Analyzer GUI used in setting the sampling specifications and parameters subsequent to the screen of FIG. 7.

FIG. 8 is an ANALYZER SETUP screen 61 where the operator has clicked on the SAMPLING tab 60 to place it in front. In this screen the user gets to make a number of conventional choices related to how data is acquired by the Logic Analyzer (e.g., clock source, rate, trigger position in the trace, etc.). By clicking on/in the 'SAMPLING PARAMETERS . . . ' box (or bar, or sub-tab) 62, however, he invokes aspects of a GUI especially directed to the tasks of monitoring and controlling one or more instances of the singly constrained sampling parameter selection processes described in connection with FIGS. 1-6, and the GUI aspects of which are the subject matter of the SAMPLING PARAMETER screens shown in FIGS. 9-14. When that GUI activity related to FIGS. 9-15 is complete, the user clicks on an OK button within that process to end it, and the ANALYZER SETUP screen 61 of FIG. 8 reappears. If there are no changes to be made, the user then clicks on the OK button 63 to leave the ANALYZER SETUP screen and enter some other screen (not shown) related to the further operation of the Logic Analyzer.

Figure 9:
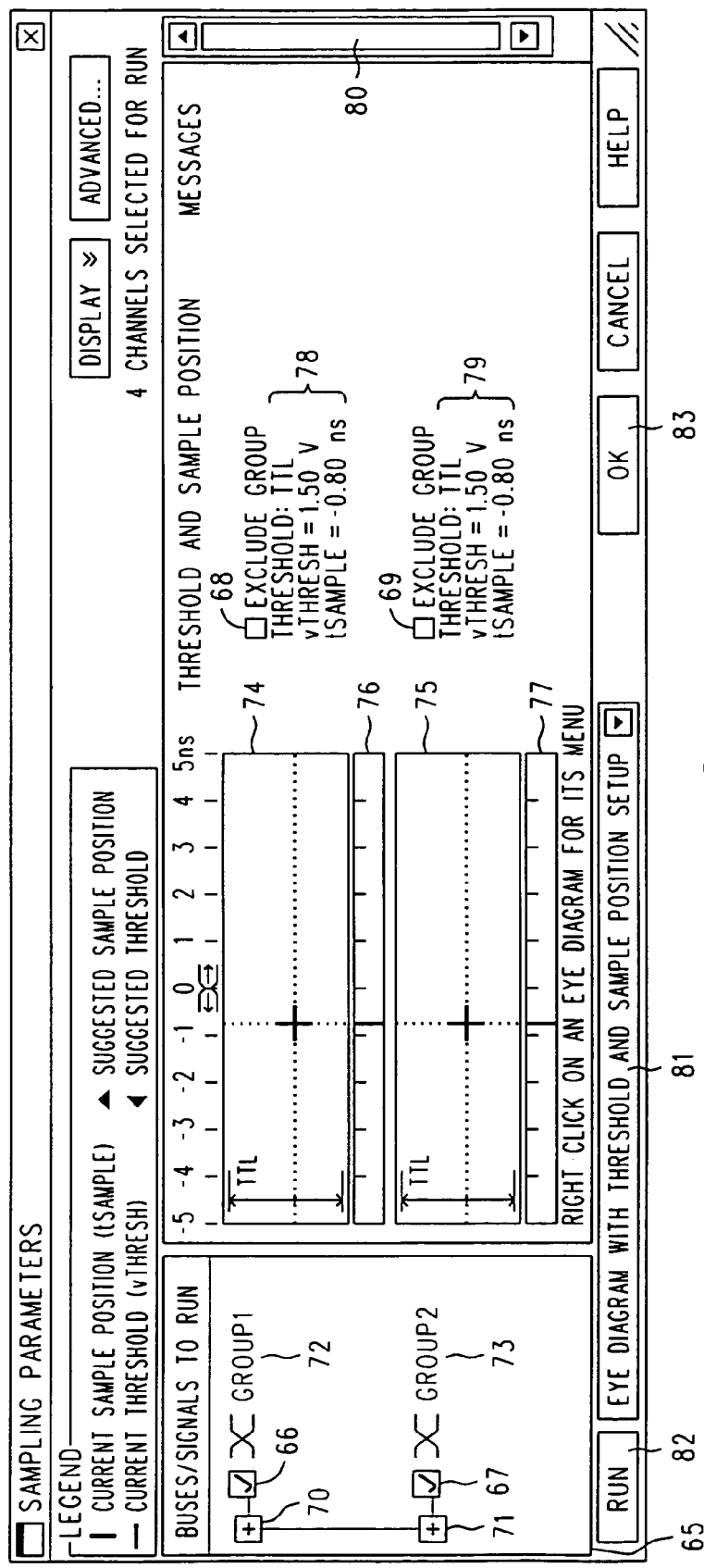
FIG. 9 is a simplified depiction of a screen of a Logic Analyzer GUI used in selecting and excluding channels to be used in the automatic discovery of recommended sampling parameters.

Refer now to FIG. 9, which is a depiction of a SAMPLING PARAMETERS screen 64 reached from the ANALYZER SETUP screen 61 by clicking on box 62 (SAMPLING PARAMETERS . . . ). In a left portion 65 of the screen 64 are depicted (72, 73) the names of the signal collections defined in FIG. 7. Note the check boxes 66 and 67; there will be one for each defined collection (even if a 'collection' contains just a single signal). These check boxes receive (as a default) check marks (√) whose presence in the check boxes indicate that the associated collection is to be a part of the automated process of selecting singly constrained sample parameter values. In this case 'be a part of' means that an eye diagram will be made for each signal in the collection when the user clicks on the RUN button 82. An entire collection can be excluded from these eye diagram measurements simply by clicking again on its associated check box; the check mark will toggle at each click.

Check boxes such as 66 and 67 have utility because of two reasons. First, making eye diagram measurements can take a significant amount of time. Second, groups need not be disjoint, in that the same channel might be in two or more groups. For some modes of SUT operation it might be useful to consider a certain channel as belonging to one group, while it also belongs to a different group during another mode of SUT operation. Rather than force the operator to re-define groups as modes of SUT operation change, we allow him to 'turn on' and 'turn off' various useful groups.

Note also check boxes 68 and 69. In similar fashion, the user may check (and un-check) these boxes by clicking on them. When checked, these boxes cause their entire associated group (collection), for however many probe pods and separate instances of constrained thresholds, to be excluded from the process of determining (a) recommended threshold(s) for (a/those) singly constrained case(s), despite that they may have had eye diagrams prepared for the individual signals that comprise the group (i.e., a corresponding box such as 66 or 67 was checked). Consider that the fixed number of probe pods available in a given situation may lead to curious or odd combinations of collections being measured with the same probe pod. So, for example, if there were a GROUP3 that shared the same probe pod as GROUP2 but which was connected to a signal altogether incompatible with the electrical characteristics of the signals making up GROUP2, GROUP3 can be excluded from eye diagram measurements, and thus also from the decision about what the constrained sampling parameter for that particular probe pod should be. The incompatibility may mean that GROUP3 cannot be measured at the same time that GROUP2 is, and vice versa, and one might have to make separate measurements after corresponding re-configurations, but those re-configurations (which are often easily done by invoking stored set-ups) will not need to include the tedious (and often risky and delicate) fussiness of attaching and detaching the actual probe connections themselves. As things proceed, we shall see that a group (collection) can be included (boxes such as 66 and 67 checked, and boxes such as 68 and 69 also checked), but that individual channels within a group (collection) can still be selectively excluded.

Before proceeding, we should note menu selection box 81 and its various choices. It offers four choices:

(1) AUTO SAMPLE POSITION SETUP (2) AUTO THRESHOLD AND SAMPLE POSITION SETUP (3) EYE DIAGRAM WITH THRESHOLD AND SAMPLE POSITION SETUP (4) EYE DIAGRAM WITH SAMPLE POSITION SETUP ONLY

Choice (1) is an automatic mode that finds recommendations for sample position while using an existing threshold (perhaps specified in advance by the operator or taken as the customary value for the logic family in use). In this mode the eye diagrams (e.g., 74 and 75 of FIG. 10) are neither measured nor present, and the sample position is taken as the midpoint of the interior region of the eye between the edges as they appear for the threshold in use. No actual eye diagrams are made.

Choice (2) is similar to choice (1), but sets the threshold to midway between observed extremes for signal excursion. No eye diagrams are made.

Choice (3) measures eye diagrams and performs automatic discovery of both recommended threshold values (as constrained by probe pod considerations) and per channel sample position.

Choice (4) measures eye diagrams and performs automatic discovery of recommended per channel sample positions while retaining previous threshold settings.

The choice shown in FIG. 9 is choice (3), which is a good one for our purposes, as it affords the user the greatest degree of flexibility in choosing the sample parameters, and in so doing invokes all the various alteration mechanisms offered by the GUI.

Boxes 76 and 77 are for display of a diagram related to an EYE FINDER feature, which feature is always present, regardless of which choice of modes was made for menu selection box 81. The EYE FINDER feature is described in the incorporated SIGNAL TRANSITION AND STABLE REGIONS DIAGRAM FOR POSITIONING A LOGIC ANALYZER SAMPLE, and is a way of representing signal margin relating to a selected or proposed threshold for that signal.

Note text legends 78 and 79. For the initial circumstances that are depicted in FIG. 9, these legends indicate that the logic family in use is TTL, and what the (default) values for threshold and sample position currently are. Since there are not yet any eye diagrams, this information is interesting, but won't really be of use until eye diagrams have been taken.

Once all the selections described above have been made, the user will click on or in the RUN box 82. This will cause the necessary eye diagram measurements to occur (the associated eye diagrams will appear in boxes 74 and 75, as described for screens in subsequent figures), along with EYE FINDER information and sample parameter recommendations (all in accordance with the selection made for menu selection box 81). The user may then accept the result by clicking on or in the OK box 83, or experiment as described in connection with subsequent figures. That experimentation might even involve the re-use of the RUN button 82. In any event, when the user is satisfied, he will finally click the OK button 83, which ends the entire sample parameter selection dialog and proceeds to subsequent Logic Analyzer operation (such as defining a trigger specification and taking data to form a trace listing).

In final connection with FIG. 9, note the slider control 80. We have shown it in the figure, even though under the particular circumstances at hand an actual implementation would probably not include it in the screen until it was actually needed. What it is for, of course, is to vertically scroll the contents of the screen when there is too much information to include at one time. In the case shown, there is not too much information, but there might have been if we had used a more complicated example. So, we included the slider 80 anyway, to indicate its existence. It is also included in subsequent figures, when either there are many groups or the expansion of a composite eye diagram for a group produces too much stuff to include in one screen, even though for the purposes of this Application we simply made the screen bigger by resorting to a two part figure (as in FIGS. 11A-B and 12A-B ), so that even in those cases (both for simplicity and for clarity of the group/channel information) the mechanism of the slider 80 was never actually invoked, and is "just there."

Figure 10:
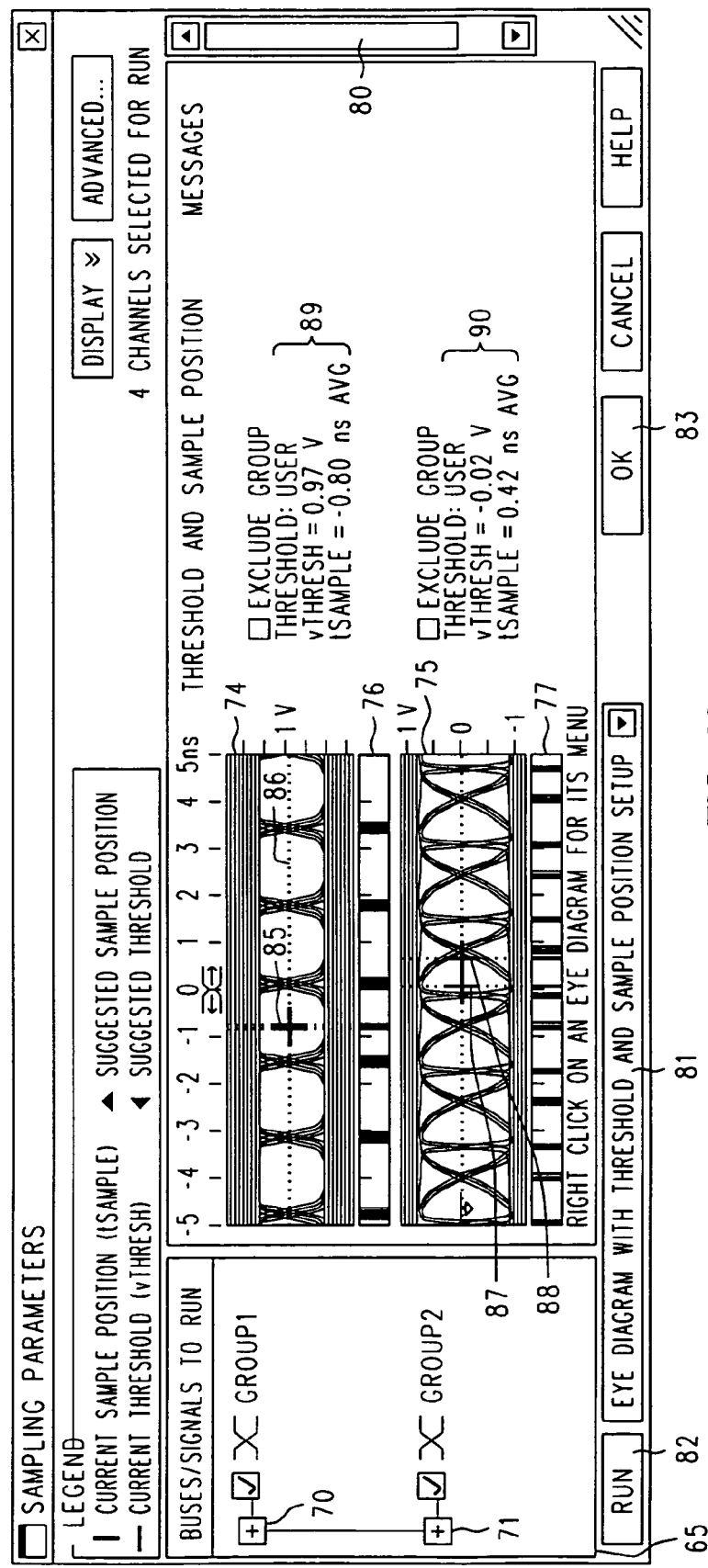
FIG. 10 is a simplified depiction of a screen of a Logic Analyzer GUI having composite eye diagrams and used in investigating and experimenting with the recommended sampling parameters subsequent to the selection made with the screen of FIG. 9.

Refer now to FIG. 10, wherein is shown a screen 84 that is arrived at from screen 64 of FIG. 9 by having clicked on or in the RUN button 82. That caused the measurement of eye diagrams for the various channels. The results are initially shown as composite eye diagrams for the two groups (named in this example GROUP1 and GROUP2). The composite eye diagram for GROUP1 appears in window 74, while that for GROUP2 appears in window 75. Beneath window 74 is an EYE FINDER display 76 that is for window 74, while beneath window 75 is a corresponding EYE FINDER display 77.

The nature of an EYE FINDER display is the subject matter of the incorporated SIGNAL TRANSITION AND STABLE REGIONS DIAGRAM FOR POSITIONING A LOGIC ANALYZER SAMPLE. In a nutshell, it shows the amount of sample position margin available at the present threshold. Note the horizontal dotted line 86 (threshold voltage) passing through cursor 85. Imagine the dotted line cutting the eye diagram in window 74 into upper and lower portions. Remove one of the portions and look "end on" at what was cut. If we further imagine that the eye diagram has some depth extending into the paper, we see the image that is the EYE FINDER diagram 76. The vertical height of the EYE FINDER diagram is the "depth extending into the paper" for the eye diagram, and is merely a device to make the EYE FINDER diagram more readily visually apprehended, since in reality, the eye diagram in window 74 does not have any depth extending into (or out of) the paper . . . .

Before leaving FIG. 10, note the various cursors representing recommended sampling parameters (more fully described in subsequent figures), and that cursor 85 is, well, fat. That is because the eye diagram in window 74 is a composite eye diagram, and cursor 85 is a "composite" of cursors for the individual component eye diagrams. In the case of the composite eye diagram in window 74 those individual cursors are fairly close together, and their combined effect is that of a fat cursor. In window 75 the individual cursors (87, 88) are close, but still separate. These various cursors indicate the recommended sampling parameters, which are also described in text form as notations 89 and 90. Note that, as a result of having taken actual eye diagram measurements with which to work, the recommended sampling parameters (89,90) for the two groups are now different from the respective default trial values 78 and 79 of FIG. 9. Furthermore, since actual sampling parameter recommendations have been made the legend "TTL" after "THRESHOLD:" is no longer appropriate, as the default TTL value is no longer in use. Threshold type is now (automatically) given as USER (i.e., as user defined). We shall more to say about this in connection with menu 109 in FIG. 12A.

Also, note the "AVG" after the stated sample position. It is there because the eye diagram 74 that it is associated with is a composite eye diagram for potentially many channels, and there might be several sample positions in use, but only one line is available for sample position in text legend 89. See eye diagram 74 (with its two cursors 87 and 88) and the tSAMPLE text entry in legend 90. It also has "AVG" appended thereto. Now remember that either or both of GROUP1 and GROUP2 might involve several probe pods. This means that there might be several instances of constrained threshold values in use, again indicated by multiple cursor positions within the eye diagram a situation not shown). If that were the case then the legend "AVG" would appear after the threshold voltages shown in text legends 89 and 90. This business of appending "AVG" is thus a device to alert the operator that the value depicted is not necessarily the exact value for any one channel. However, upon consideration, it will also be appreciated that for the constrained parameter, if "AVG" is not appended to the legend then the stated value is exact, and is also (and correctly so) the average. That is, the average of several things all having the same value is just that value . . . .

It will be appreciated that the situation as shown in screen 84 of FIG. 10 is mainly for the operator's information, and that (although it can be done, sort of) it is not principally for the purpose of allowing the operator to adjust the sampling parameters. To do that comfortably, we need a screen with a bit more specificity by channel.

Figure 11A:
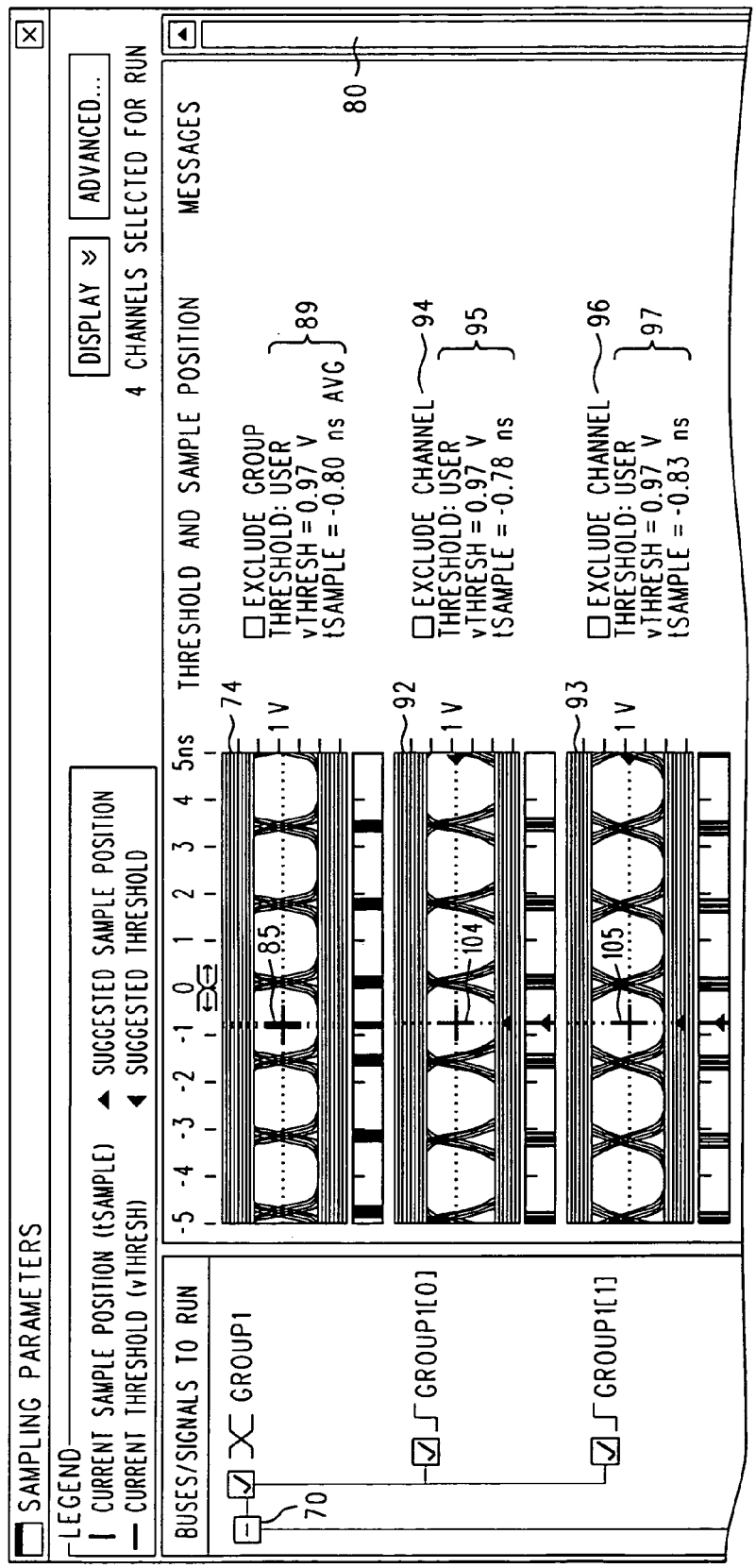
FIGS. 11A and 11B are a simplified depiction of a screen of a Logic Analyzer GUI having both composite eye diagrams and expansions thereof into their individual component eye diagrams, and used in investigating and experimenting with the recommended sampling parameters subsequent to the selection made with the screen of FIG. 9.
Figure 11B:
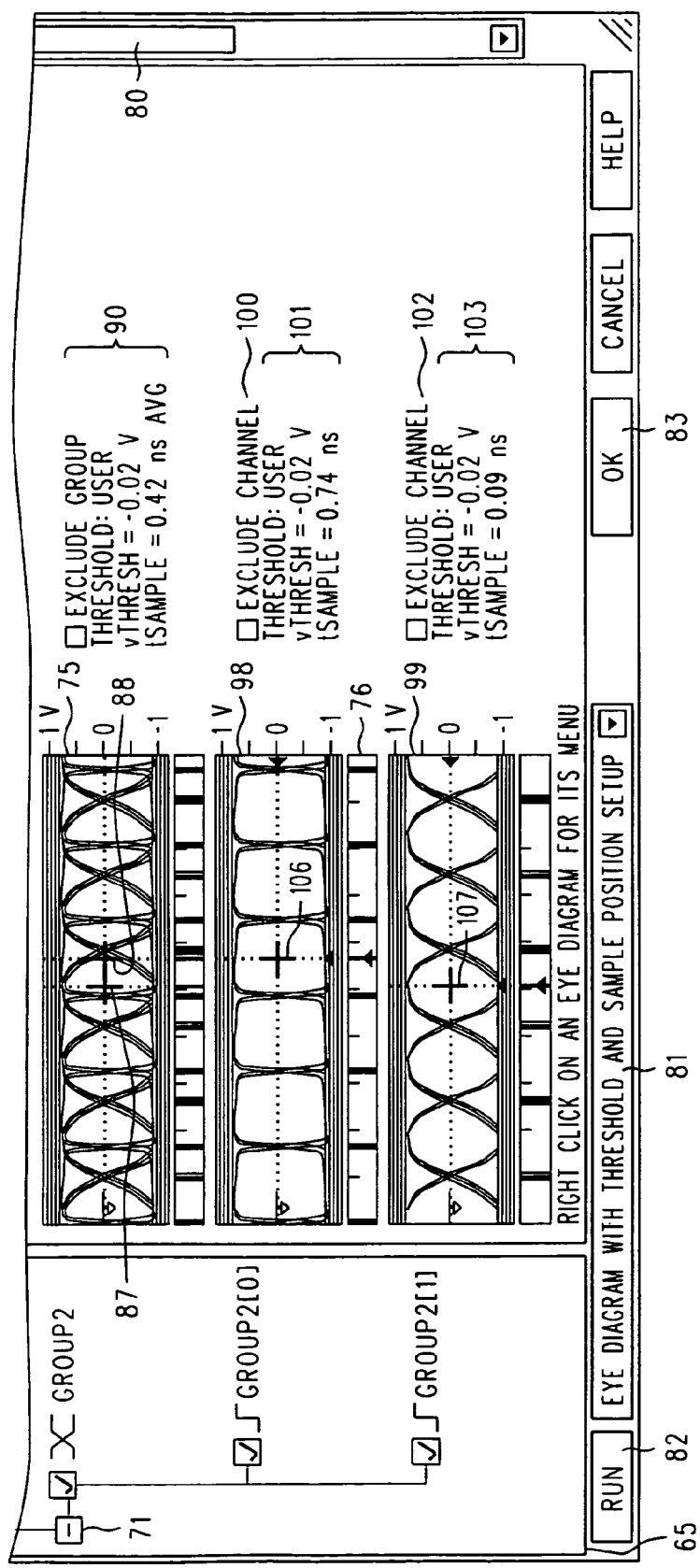

In FIGS. 11A-B the composite eye diagrams in windows 74 and 75 have been expanded to show their respective component eye diagrams. To accomplish this the user clicked on box 70 for GROUP1 to change it from a "+" to a "−", and similarly on box 71 for GROUP2. The composite eye diagram for GROUP1 is expanded into its component eye diagrams in windows 92 and 93, which are also now accompanied by legends 94 and 95 for channel 0 of GROUP1 (GROUP1 [0]), and legends 96 and 97 for channel 1 of GROUP1 (GROUP1 [1]). Note that the "AVG" legends are now absent from the expanded material. Legends 94 and 96 include check boxes that allow their respective channels to be excluded from consideration while arriving at a recommended value for the constrained sampling parameter (which in this case is threshold voltage). In like manner, the composite eye diagram for GROUP2 is expanded into its component eye diagrams in windows 98 and 99, which are also now accompanied by legends 100 and 101 for channel 0 of GROUP2, and legends 102 and 103 for channel 1 of GROUP2. Legends 100 and 102 include check boxes that allow their respective channels to be excluded from consideration.

In the event that a channel was an 'outlier' that was ignored by the automatic selection mechanism previously described, the channel could automatically be marked as to be excluded, and a message to that effect presented in the MESSAGES region in the far right portion of the display.

Each component eye diagram has it own cursor indicating where in that eye diagram the associated legend says the recommended location is. So, cursor 104 goes with legend 95, cursor 105 with legend 97, cursor 106 with legend 101, and cursor 107 with legend 103. Notice for GROUP2 how cursors 87 and 88 in the composite eye diagram are just replications of the cursors 106 and 107. It is now clear why "fat cursor" 85 is fat; it is that way because cursors 104 and 105 are very nearly (but not exactly) in identical locations.

Figure 12A:
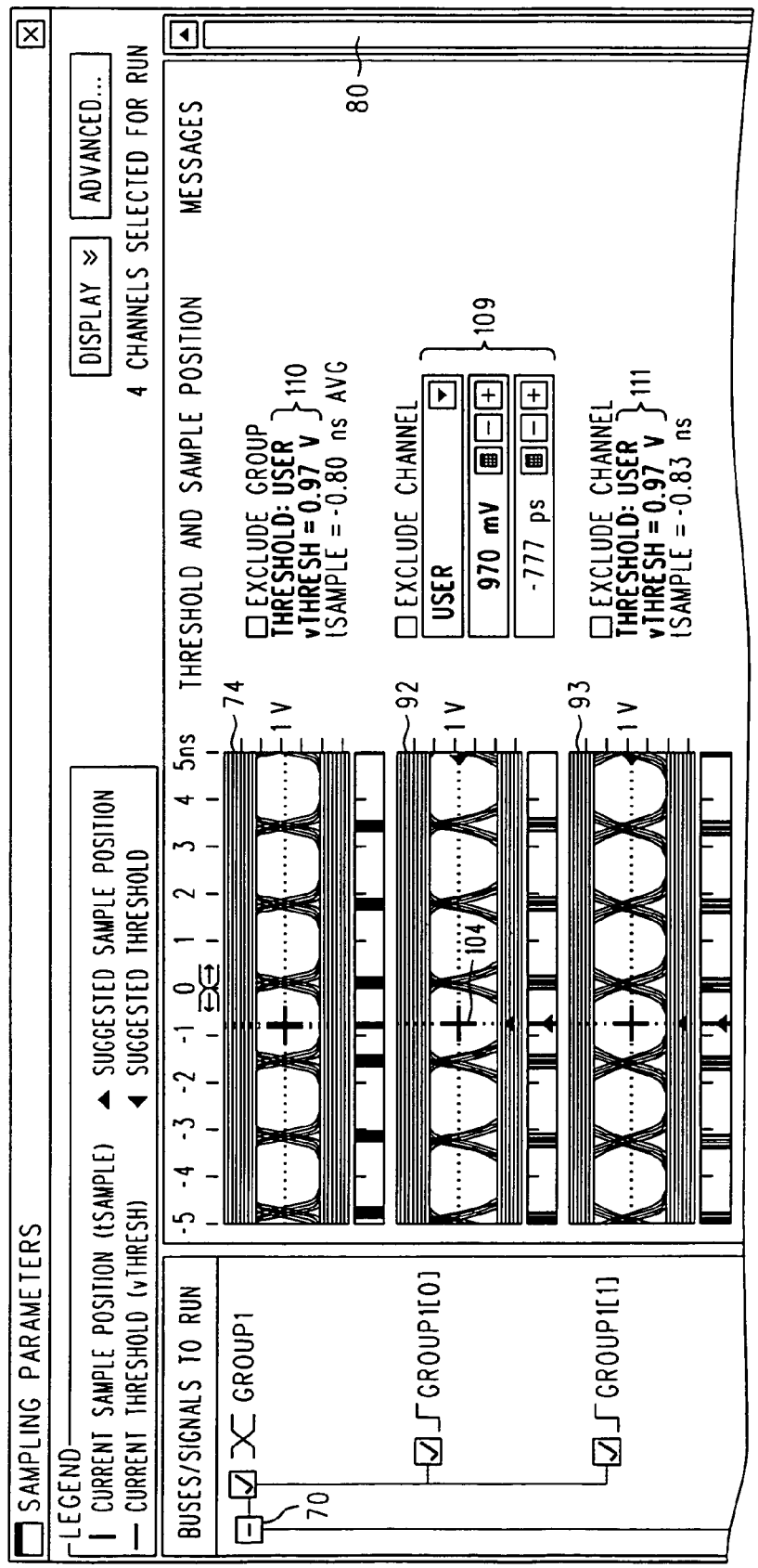
FIGS. 12A and 12B are a simplified depiction of a screen of a Logic Analyzer GUI having both composite eye diagrams and expansions thereof into their individual component eye diagrams, and illustrating how commonly constrained sampling parameter values are indicated during investigation and experimentation with the recommended sampling parameters subsequent to the selection made with the screen of FIG. 9.
Figure 12B:
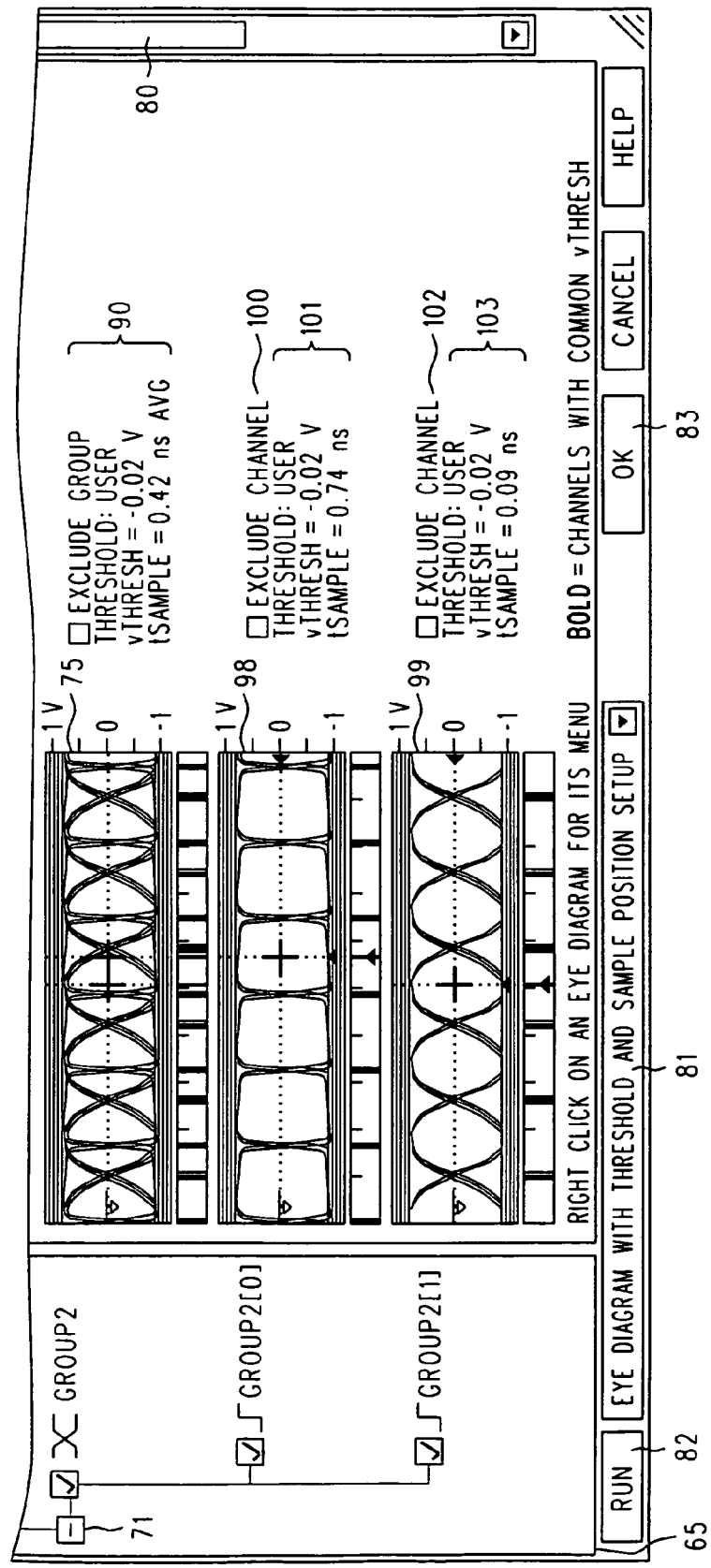

Now turn to FIGS. 12A-B and assume that the user wishes to modify or experiment with the recommended sampling parameters for channel 0 of GROUP1. There are two ways he can do this. The first is to click on the cursor 104 and drag it to a new threshold and/or sample position. (Changing sample position this way may exhibit additional UI-related properties described below.) The second is to simply click on or in window 92 or over the associated legend (95 in FIG. 11A). In either case, legend 95 is replaced with menu 109. Menu 109 includes bold characters for the common constrained parameter, which in this case is threshold voltage. The non-constrained parameter (sample position) is not in bold. Furthermore, the threshold portions 110 and 111 of other legends pertaining to GROUP1 are also rendered in bold. This is a visual cue to the user that if he changes the constrained sampling parameter for channel 0 of GROUP1, that the constrained parameter value for all the other channels in that group (or in any other group!) that are part of the same constrained collection (think probe pods!) will also change. To actually effect a change the cursor 104 is either dragged to a proposed location or the menu 109 is used. To use the menu one can either use the "+" or "−" buttons therein to increment or decrement the threshold value, or, the new value can simply be keyed in as a keyboard editing operation in conjunction with the mouse pointer (not shown).

The other button next to the "+" and "−" buttons in menu 109 brings up a small calculator screen that facilitates doing arithmetic useful in manually arriving at trial values for sampling parameters.

In a preferred embodiment only one menu (such as 109) for a group or one of its components is displayed at a time. An action that would open another menu closes an existing one. (Multiple menus were implemented but this found to make the display appear extremely 'busy' and encouraged operator error. One menu at a time is sufficient.) To close an existing menu without opening another, the operator simply clicks in the white space under the legend MESSAGES on the right-hand portion of the screen.

As an aside, we may note that these same mechanisms for altering sampling parameters are available in FIG. 10, where the eye diagrams are not expanded and only the composite eye diagram is shown. However, such modifications cannot be directed to a single channel among those of a group. Instead, the system will construe an indicated change as one to be applied to all channels in the group in unison.

In addition, the legend USER in menu 109 means "USER DEFINED" or "CUSTOMIZED." It refers to the threshold, and the other choices are related to families of logic, such as TTL, ECL, MOS, etc. If one of those other choices is selected, then default values for the threshold would be used, unless changed by subsequent operation. We have shown USER in the figures, as this is the most appropriate choice for operation in the selected mode shown in menu 81 (EYE DIAGRAM WITH THRESHOLD AND SAMPLE POSITION SETUP.)

Figure 13:
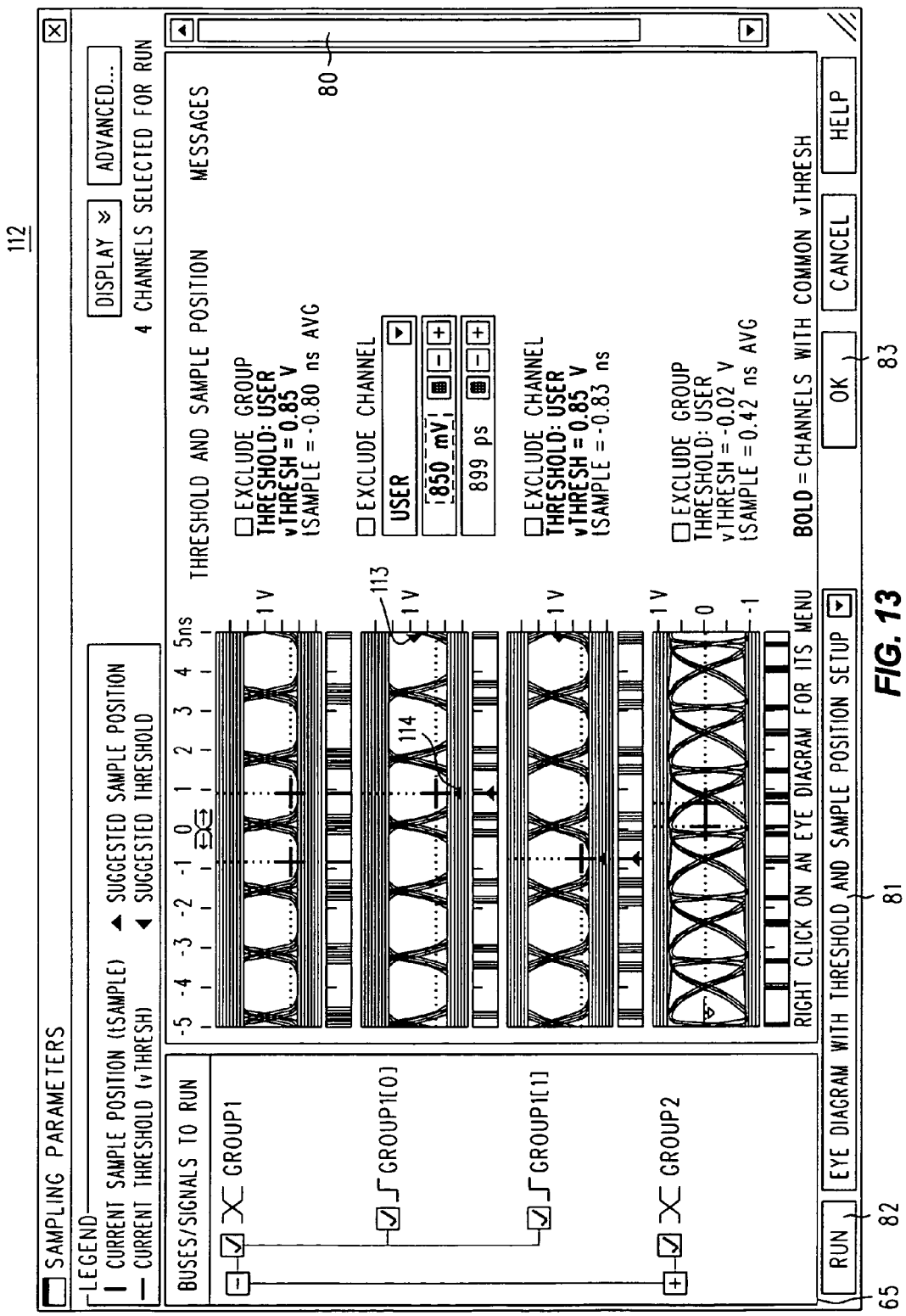
FIG. 13 is a simplified depiction of a screen similar to that of FIGS. 12A and 12B.

Refer now to FIG. 13 and its depiction of screen 112. Relative to the situation as it was left in FIGS. 12A-B, the user has collapsed GROUP2 and moved the threshold for GROUP1 from 970 mV to 850 mV, and moved the sample position for GROUP1 [0] one cycle to the right (from −777 ps to 899 ps). Note that the effect of this is also visible as changes in the EYE FINDER diagrams for GROUP1 [0], as between FIG. 12A and FIG. 13. In the event that he later has regrets and wants to put a sample parameter value back to what its original recommendation was, note triangular pointers 113 and 114. Pointer 113 indicates the original threshold recommendation. Pointer 114 represents the original sample position recommendation, but relative to the changed signal cycle. Pointers 113 and 114 (as well as similar pointers for expanded groups) continue to indicate the original recommendations for sampling parameters, even though the values in use might be changed through experimentation. The cross-shaped cursors in the eye diagrams always indicate the values in effect, which may be different. Changes to the values in effect are invoked immediately, as they are made. Experimental changes may be made (and subsequently undone as if by another change) by using the + and − buttons in the menu to the right of the eye diagram, or by dragging the cross-shaped cursor within an eye diagram. Another mechanism described in connection with FIG. 14 allows, on a per channel basis, the automatic removal of all experimental changes and a return to either or both of the original recommended sampling parameter values.

An implication of FIG. 13 is that the signal period is 1676 ps and that the operator merely dragged the sample position from one eye opening to the other, and the system 'snapped it' to the corresponding location by making an adjustment of exactly one signal period, so that pointer 114 is in same location within the new eye as it was in the previous one. Had the operator actually wanted to change the sample position by other than an exact period, he would have used the +and − buttons adjacent the sample position value in menu 109. Then the cursor within the eye opening would move accordingly while the pointer 114 would remain in its original position relative to the eye opening that it is currently within. (This business of moving the sample position from one cycle to an adjacent one by exactly one period is a well known device practiced by users of Logic Analyzers to deal with set-up and hold issues, such as "What was the signal just before the clock?" as opposed to "What was the signal just after the clock?")

Figure 14:
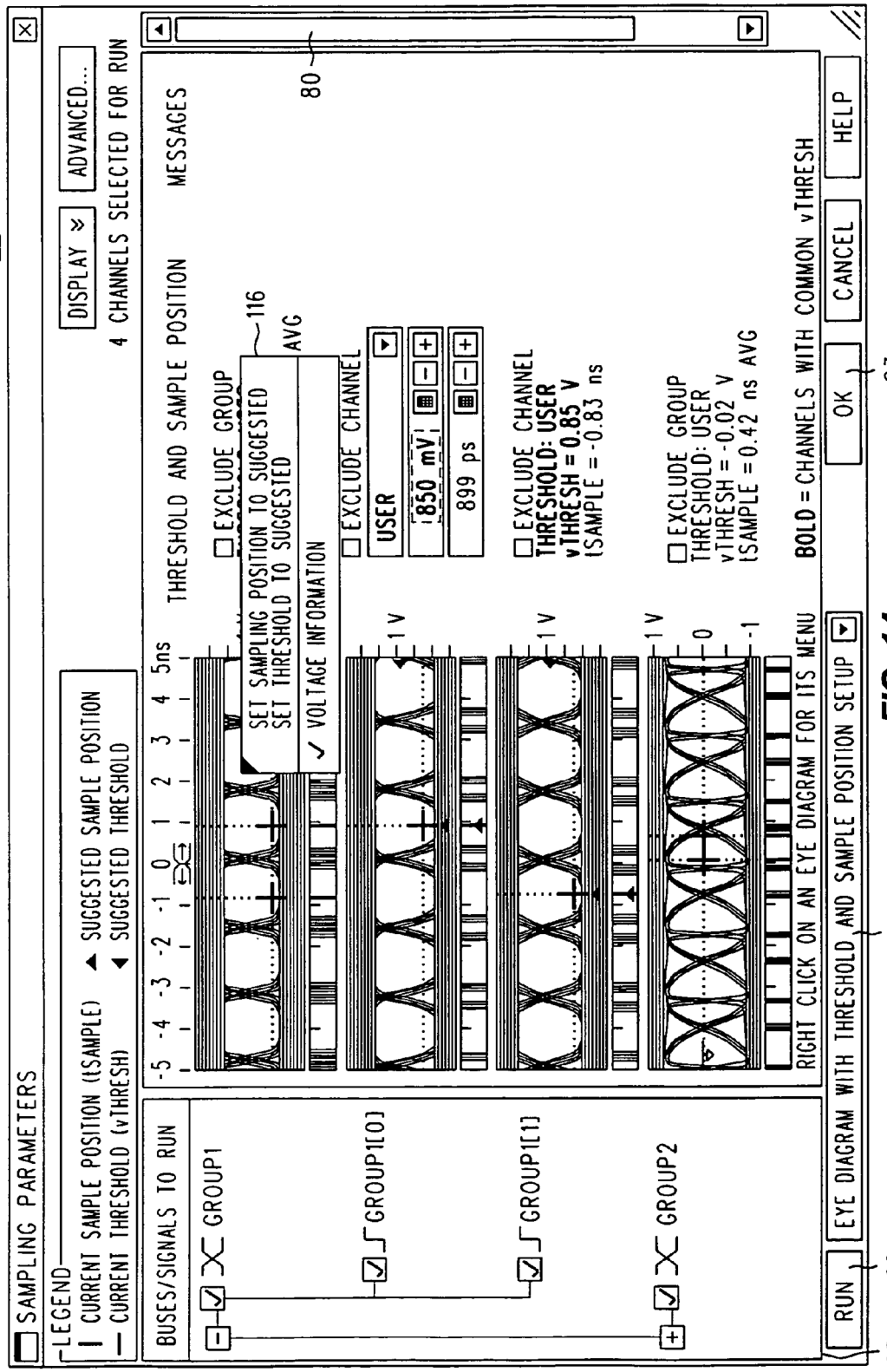
FIG. 14 is a simplified depiction of a screen similar to that of FIGS. 12A and 12B, and showing a per channel menu usable to implement suggested sampling parameter values or changes thereto.
Figure 15:
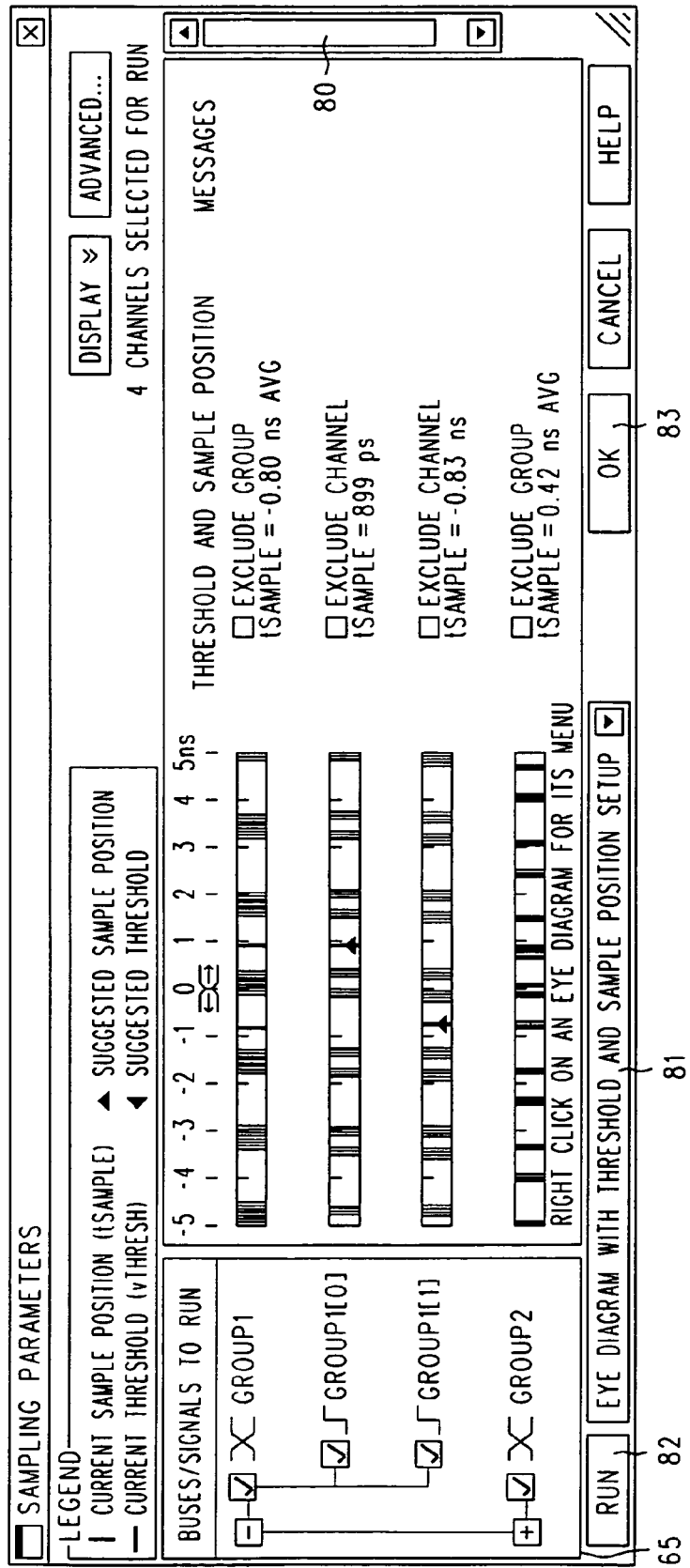
FIG. 15 is a simplified depiction of a screen similar to that of FIG. 14 after a VOLTAGE INFORMATION option has been de-selected.

Now refer to FIG. 14, which depicts a screen 115 illustrating a menu feature 116 that invokes either or both of the original suggested sampling parameters for all channels in a group (or for an individual channel), as indicated by triangular pointers associated with such channels (e.g., 113 and 114 of FIG. 13). To obtain menu 116 for a channel the operator right clicks on an eye diagram for that channel (or on the EYE FINDER display if the eye diagram is not visible): menu 116 is the "ITS MENU" referred to in the legend at the bottom of the screen below the eye diagrams. Only one 116-style menu will be produced at a time. If an attempt is made to produce another one while an earlier one is visible, the earlier one closes and is replaced by the new one. An existing menu 116 will close when one of its choices is selected by clicking on one of its entries (which is then also implemented). An existing menu 116 can also be closed without implementing a choice by clicking in the empty space at the right of the screen 115 that is beneath the legend "MESSAGES."

FIG. 14 shows a case where menu 116 has been produced for the all channels in the collection called GROUP1 by right clicking on its composite eye diagram. The menu 116 includes three choices. The first is SET SAMPLING POSITION TO SUGGESTED. If this choice is selected the sampling positions of both GROUP1 [0] and GROUP1 [1] will be set back to their original recommended values indicated by the associated triangular pointers (e.g., 114 in FIG. 13). The second choice is SET THRESHOLD TO SUGGESTED. If this choice is selected the thresholds of GROUP1[0] and GROUP1 [1] will be set back to the original recommended values indicated by their associated triangular pointer (e.g., 113 of FIG. 13). Supposing that both sample position and threshold had been altered, two respective menu operations would be needed to get them both back to their original values, although one can easily imagine an additional choice "SET BOTH TO SUGGESTED" that would require only one operation with the menu 116.

As described thus far, the menu 116 mechanism operates collectively on all channels within a group. This is especially handy when a group is for many channels, and several probe pods are involved, each with its own instance of a constrained sampling parameter for those channels served by the pod. The scope of menu 116's control can be changed to just a single channel within a group if menu 116 were produced by clicking on a component eye diagram. As shown in FIG. 14, the (solidly shaded) upper left-hand corner of menu 116 is at the location within the composite eye diagram where the operator right clicked to obtain the menu. As described, that menu pertains to all channels in GROUP1. To get a menu 116 that pertains only to, say, GROUP1 [1 ], the operator would position the mouse pointer (not shown) over some location in its eye diagram and then click. The location of the resulting 116-style menu would then be over the (component) eye diagram for GROUP1 [1].

The third choice shown in menu 116 is "VOLTAGE INFORMATION." Selecting this choice toggles the presence or absence of a check mark √ at the start of the legend announcing the choice. When the check mark is present the eye diagrams (whether composite or component) are visible, as previously described. When the check mark is absent all the eye diagrams in the screen are suppressed therefrom to provide more room to compare the EYE FINDER diagrams (76,77, etc.). This is the situation shown in FIG. 15, where it will also be noted that all textual information related to threshold has been removed from the legends in the column under the heading legend THRESHOLD AND SAMPLE POSITION. The EYE FINDER displays remain, however, and right clicking on one of them will bring up its 116-style menu, so that the check mark for voltage information can be reinstated, if desired. Subsequent to that the suppressed eye diagrams and textual voltage information are restored to the screen.

---

Objective

---

Find an "optimal" threshold voltage, V_TH_SUGGESTED, to use for a group of channels which all share the same threshold voltage setting. The group may be a pod of sixteen input channels for a logic analyzer.

There are N inputs sharing the same threshold setting.

-----

Given

-----

An array with N elements. Each element has:
  An indication of whether an eye diagram measurement has been made for that channel.
  The results of an eye diagram measurement on that channel, if any.
  If a measurement was taken, a chosen "selected" eye.
  If there is a "selected" eye, it's normalized representation.
  A Figure of Merit (FOM) for each point in the clear eye opening.
  The FOM is a floating point number with these characteristics:
    The FOM for all points in the eye opening is greater than 0.0.
    The FOM for a point exactly 1 unit of voltage merit and 1 unit of time merit from the nearest boundary cell is 1.0.
    The FOM increases monotonically as the margin in time and volts from the point to the nearest boundary cell increases.

---

Procedure

---

(1) Build a list, MEASURED_EYES, with the normalized, selected, eye opening for each channel of interest that has one. Exclude channel(s) that:
  (a) Were not measured (e.g. because the user knows it is not connected to a signal);
  (b) Were measured but had a "flat line" signal (e.g. a grounded input). A "flat line" signal can be defined as a signal with an amplitude less than some number of volts, e.g. 200 mV, or 0.5*vSwingMin;
  (c)) Were measured but there was no usable eye opening (e.g. a signal not synchronous to the clock in use); or
  (d) Were marked by the user to be excluded (e.g. by clicking a checkbox).
(2) If only one eye remains:
V_TH_SUGGESTED=suggested threshold for the eye—DONE!
If no eye remains:
V_TH_SUGGESTED=the current threshold setting (no change suggested)—DONE!
(3) Find useful parameters for subsequent processing:
  (a) VNORM_MIN: the lowest (most negative) normalized voltage at which any member of MEASURED_EYES has at least one cell in its clear eye opening.
  (b) VNORM_MAX: the highest (most positive) normalized voltage at which any member of MEASURED_EYES has at least one cell in its clear eye opening.
  (c)) VNORM_STEP_MIN: the numerically smallest normalized voltage step size in normalized voltage of any member of MEASURED_EYES.
  (d) Adjust VNORM_MIN to be the most positive multiple of VNORM_STEP_MIN equal to or more negative than the value found in step (a)
  (e) Adjust VNORM_MAX to be the most negative multiple of VNORM_STEP_MIN equal to or more positive than the value found in step (b)
  (f) NUM_VNORM_STEPS: the number of normalized voltage steps, each of size VNORM_STEP_MIN, from VNORM_MIN to VNORM_MAX, inclusive:

NUM_$V$NORM_STEPS=(($V$NORM_MAX−$V$NORM_MIN)/$V$NORM_STEP_MIN)+1

(g) NUM_CHANNELS=the number of items in the MEASURED_EYES list.
(4) Process the MEASURED_EYES list to find those selected eyes that have a mutually "useful" overlap in voltage. (We need not be concerned about overlap in time since sample positions can be set independently for each channel.)

A "useful" overlap provides for at least one position in each of the mutually overlapping eyes that is in the clear eye opening of each. Additionally, it is preferred that at least one unit of time margin and one unit of voltage margin exists from at least one point of overlap in each to the nearest boundary in that eye. However, some eyes will not have any points with the desired margin. In that case, the point(s) with the best margin in those eyes will be considered.

Create a two dimensional array CANDIDATE_VOLTAGES of floating point numbers. The first index goes from 1 to NUM_CHANNELS. The second index goes from 1 to NUM_VNORM_STEPS. The floating point value serves two purposes:

- A nonzero value indicates that one or more points exists in the eye for the indexed channel at the indexed normalized voltage level; and
- The value itself indicates the maximum of the figures of merit for all points in the channel's eye opening at that normalized voltage.

Create a one dimensional array BEST_FOMS of integers to record the VNORM of the best margin found in channels whose best margin is less than 1.0. The index goes from 1 to NUM_CHANNELS. This array will be used for special casing channels with no points with at least one unit of margin in both time and volts.

Initialize all elements of CANDIDATE_VOLTAGES and BEST_FOMS to 0.

CHANNEL_NUMBER=0
For each CHANNEL_NUMBER from 1 to NUM_CHANNELS, inclusive, stepping by 1:
{
Keep track of the best overall margin found. Some eyes may small enough that no locations have a margin of at least one unit. This will be special cased after the loops below.
    BEST_VNORM_INDEX=0
    BEST_FOM=0
    For each VNORM_INDEX from 1 to NUM_VNORM_STEPS, inclusive, stepping by 1:

```
    {
        VNORM = VNORM_MIN + ((VNORM_INDEX – 1) * VNORM_STEP_MIN)
        If VNORM is within the limits of normalized voltage defined
by the normalized eye structure for this channel (CHANNEL_NUMBER),
then
        {
```

ROW=the row in the eye structure closest to VNORM
            FOM_MAX=0
            COLUMN_AT_MAX=–1
            NUM_COLUMNS=number of columns in this row of the eye structure

```
            For each COL from 1 to NUM_COLUMNS, inclusive, stepping by 1:
            {
                If the cell at (COL,ROW) is in the clear eye opening:
                {
                    Record the Figure of Merit (FOM) in the candidate voltages array:
                    CANDIDATE_VOLTAGES[CHANNEL_NUMBER][VNORM_INDEX] = FOM
                    Update the overall best:
                    If FOM > BEST_FOM
                    {
                        BEST_FOM = FOM
                        BEST_VNORM_INDEX = VNORM_INDEX
                    }
                }
            }
        }
    }
    If BEST_FOM < 1.0
    {
        BEST_FOMS[CHANNEL_NUMBER] = BEST_VNORM_INDEX
    }
}
```

Create a summary array, NUM_CHANNELS_HISTOGRAM, a one dimensional array of integers with an index running from 1 to NUM_VNORM_STEPS. This array will record the number of channels with at least one unit of margin in time and volts at each voltage level. Special cased channels will be added at their best (highest FOM) voltage level only.

Initialize all elements of NUM_CHANNELS_HISTOGRAM to 0.

For each CHANNEL_NUMBER from 1 to NUM_CHANNELS, inclusive, stepping by 1:

```
{
    If BEST_FOMS[CHANNEL_NUMBER] is 0 (this channels' best FOM is >= 1.0)
```

```
                {
                    For each VNORM_INDEX from 1 to NUM_VNORM_STEPS, inclusive, step
by 1:
                    {
                        If CANDIDATE_VOLTAGES[CHANNEL_NUMBER][VNORM_INDEX] >= 1.0
                        {
                            Add 1 to NUM_CHANNELS_HISTOGRAM[VNORM_INDEX]
                        }
                    }
                }
                else This channel had no locations with a margin of at least 1.0.
                {
                    Add 1 to
                        CANDIDATE_VOLTAGES[CHANNEL_NUMBER][BEST_FOMS[CHANNEL_NUMBER]]
                }
        }
```

(5) Process the histogram and select the answer, V_TH_SUGGESTED

Find MAX_OVERLAP and N_WITH_MAX_OVERLAP, the largest value in NUM_CHANNELS_HISTOGRAM and the number of locations with that count. This is the greatest number of channels from those in MEASURED_EYES that form a mutually useful overlap in voltage.

MAX_OVERLAP=0
N_WITH_MAX_OVERLAP=0
VNORM_INDEX_AT_MAX=−1

For each VNORM_INDEX from 1 to NUM_VNORM_STEPS, inclusive, step=1:

```
        {
            If NUM_CHANNELS_HISTOGRAM[VNORM_INDEX] > MAX_OVERLAP
            {
                MAX_OVERLAP              = NUM_CHANNELS_HISTOGRAM[VNORM_INDEX]
                N_WITH_MAX_OVERLAP       = 1
                VNORM_INDEX_AT_MAX       = VNORM_INDEX
            }
            else If NUM_CHANNELS_HISTOGRAM[VNORM_INDEX] == MAX_OVERLAP
            {
                Add 1 to N_WITH_MAX_OVERLAP
            }
        }
        If N_WITH_MAX_OVERLAP is 1, then the answer is:
                V_TH_SUGGESTED = VNORM_MIN + ((VNORM_INDEX_AT_MAX − 1) *
VNORM_STEP_MIN)
                DONE!
```

We have two or more voltage levels each with the same number of channels in the overlap. Which one should be picked? To choose, we find the least of the maximal FOMs for the overlapped channels at each normalized voltage level (these are recorded in the CANDIDATE_VOLTAGES array). The normalized voltage level with the greatest of the least of the maximal FOMs is the one we want.

FOM_MAX_MIN=0;
VNORM_INDEX_AT_MAX_MIN=−1

```
            For each VNORM_INDEX from 1 to NUM_VNORM_STEPS, inclusive, step = 1:
            {
                FOM_MIN = 1.0e+300
                If NUM_CHANNELS_HISTOGRAM[VNORM_INDEX] == MAX_OVERLAP
                {
                    Find the minimum FOM for the channels at this normalize voltage.
            For each CHANNEL_NUMBER from 1 to NUM_CHANNELS, inclusive, step = 1:
                    {
                        FOM = 0.0
                        If BEST_FOMS[CHANNEL_NUMBER] is 0 (this ch's best FOM is >= 1.0)
                        {
                            FOM = CANDIDATE_VOLTAGES[CHANNEL_NUMBER][VNORM_INDEX]
                        }
```

-continued

```
        else The channel had no points with a FOM >= 1.0
        {
            Use a nominal 0.9 for the FOM
            FOM = 0.9
        }
        If FOM < FOM_MIN
        {
            FOM_MIN = FOM
        }
      }
    }
    If FOM_MIN > FOM_MAX_MIN
    {
        FOM_MAX_MIN = FOM_MIN
        VNORM_INDEX_AT_MAX_MIN = VNORM_INDEX
    }
}
```

Applying the tie breaker, the answer is:

V_TH_SUGGESTED=VNORM_MIN+((VNORM_INDEX_AT_MAX_MIN-1)*VNORM_STEP_MIN) DONE!

* * * * * * * * * * * * * *

I claim:

1. In a logic analysis system receiving digital signals with channels each having respective data receivers operated in at least one signal set having at least two channels and their data receivers therein and wherein each signal set shares in common a constrained sampling parameter value while each data receiver in a signal set also has an independently variable unconstrained sampling parameter, a Graphical User Interface for selecting the constrained sampling parameter value for a signal set and also unconstrained sampling parameter values for the channels in the signal set, the Graphical User Interface comprising:
  (a) a first screen where channels to be used in a measurement and sharing a constrained sampling parameter are associated with a signal set and one or more channels are declared as belonging to one or more groups;
  (b) a second screen including an eye diagram measurement control that causes the measurement of eye diagrams of channels belonging to groups, wherein the second screen also includes for each group a group expansion control that expands a respective composite eye diagram for an associated group into a plurality of component eye diagrams for the channels belonging to the group and each component eye diagram contains a cursor indicating recommended sampling parameter values; and
  (c) subsequent to a use of the eye diagram measurement control, the second screen also including composite eye diagrams for each group and including cursors positioned thereon indicating recommended sampling parameters for each channel in the group.

2. A Graphical User Interface as in claim 1 wherein each component eye diagram is accompanied by a respective text display of the constrained and unconstrained sampling parameter values for the associated channel.

3. A Graphical User Interface as in claim 1 wherein each component eye diagram is accompanied by a respective channel exclusion control that removes the associated channel fi-om consideration for finding recommended sampling parameters.

4. A Graphical User Interface as in claim 1 wherein dragging the cursor to a new location changes the associated sampling parameters for the channel associated with the component eye diagram and also replicates any change to the constrained sampling parameter in any other channel belonging to the same signal set as the channel associated with the component eye diagram.

5. A Graphical User Interface as in claim 2 wherein the portion of the text display pertaining to a constrained sampling is highlighted whenever any channel belonging to the associated signal set is selected to undergo a change in the value of the constrained sampling for that associated signal set.

6. A Graphical User Interface as in claim 1 wherein a selected component eye diagram is accompanied by a respective first menu allowing alteration of the sampling parameter values for the channel associated with the selected component eye diagram.

7. A Graphical User Interface as in claim 6 wherein the portion of the first menu pertaining to a constrained sampling parameter is highlighted whenever any channel belonging to the associated signal set experiences a change in the value of the constrained sampling for that associated signal set.

8. A Graphical User Interface as in claim 1 wherein a selected component eye diagram is accompanied by a respective second menu that includes a choice that restores altered constrained sampling parameter values to their originally recommended values.

9. A Graphical User Interface as in claim 1 wherein a selected component eye diagram is accompanied by a respective second menu that includes a choice that restores altered unconstrained sampling parameter values to their originally recommended values.

10. A Graphical User Interface as in claim 1 wherein a selected component eye diagram is accompanied by a respective second menu that includes a choice that alternately includes and excludes from the second screen all eye diagrams and all information pertaining to the constrained sampling parameter.

11. A Graphical User Interface as in claim 1 wherein the second screen includes for each channel a display of locations in time for signal transitions through a current threshold voltage.

* * * * *